(12) United States Patent
Karakawa et al.

(10) Patent No.: US 11,818,844 B2
(45) Date of Patent: Nov. 14, 2023

(54) SEMICONDUCTOR MODULE AND ELECTRONIC APPARATUS

(71) Applicant: CANON KABUSHIKI KAISHA, Tokyo (JP)

(72) Inventors: Yuya Karakawa, Kanagawa (JP); Mitsutoshi Hasegawa, Kanagawa (JP); Takashi Aoki, Chiba (JP); Noritake Tsuboi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/826,013

(22) Filed: May 26, 2022

(65) Prior Publication Data

US 2022/0386468 A1    Dec. 1, 2022

(30) Foreign Application Priority Data

May 31, 2021   (JP) ................................. 2021-091341
May 31, 2021   (JP) ................................. 2021-091342

(51) Int. Cl.
    *H05K 1/18*        (2006.01)
    *H01L 23/498*      (2006.01)
    *H05K 3/34*        (2006.01)
    *H05K 1/14*        (2006.01)

(52) U.S. Cl.
CPC ....... *H05K 1/181* (2013.01); *H01L 23/49816* (2013.01); *H05K 3/3452* (2013.01); *H05K 3/3485* (2020.08); *H05K 1/148* (2013.01); *H05K 2201/0989* (2013.01); *H05K 2201/10015* (2013.01); *H05K 2201/1053* (2013.01); *H05K 2201/10378* (2013.01); *H05K 2201/10515* (2013.01); *H05K 2201/10636* (2013.01); *H05K 2201/10734* (2013.01); *H05K 2203/048* (2013.01); *H05K 2203/306* (2013.01)

(58) Field of Classification Search
CPC ...... H05K 1/181; H05K 1/148; H05K 3/3485; H05K 3/3452; H05K 2201/0989; H05K 2201/10015; H05K 2201/10378
USPC .......................................................... 361/777
See application file for complete search history.

(56) References Cited

U.S. PATENT DOCUMENTS

2010/0148172 A1*   6/2010   Watanabe ................ H01L 24/48
                                                              257/E23.179
2020/0411424 A1*   12/2020   Takahashi ......... H01L 23/49838

FOREIGN PATENT DOCUMENTS

JP         2020-205409 A     12/2020
WO       2005/024945 A1     3/2005
WO    WO-2020250947 A1 *   12/2020 ............. H01L 21/60

* cited by examiner

*Primary Examiner* — Andargie M Aychillhum
(74) *Attorney, Agent, or Firm* — Canon U.S.A., Inc. I.P. Division

(57) ABSTRACT

A semiconductor module includes a semiconductor device having a first land, a second land, and a third land, a wiring board having a substrate, and a fourth land, a fifth land, and a sixth land disposed on the main surface of the substrate, a chip component having a first electrode and a second electrode disposed across a distance in the longitudinal direction and being disposed between the wiring board and the semiconductor device, a first solder joint for bonding the first land, the fourth land, and the first electrode, a second solder joint for bonding the second land, the fifth land, and the second electrode, and a third solder joint for bonding the third land and the sixth land. The volume of the first solder joint and the volume of the second solder joint are each larger than the volume of the third solder joint.

18 Claims, 12 Drawing Sheets

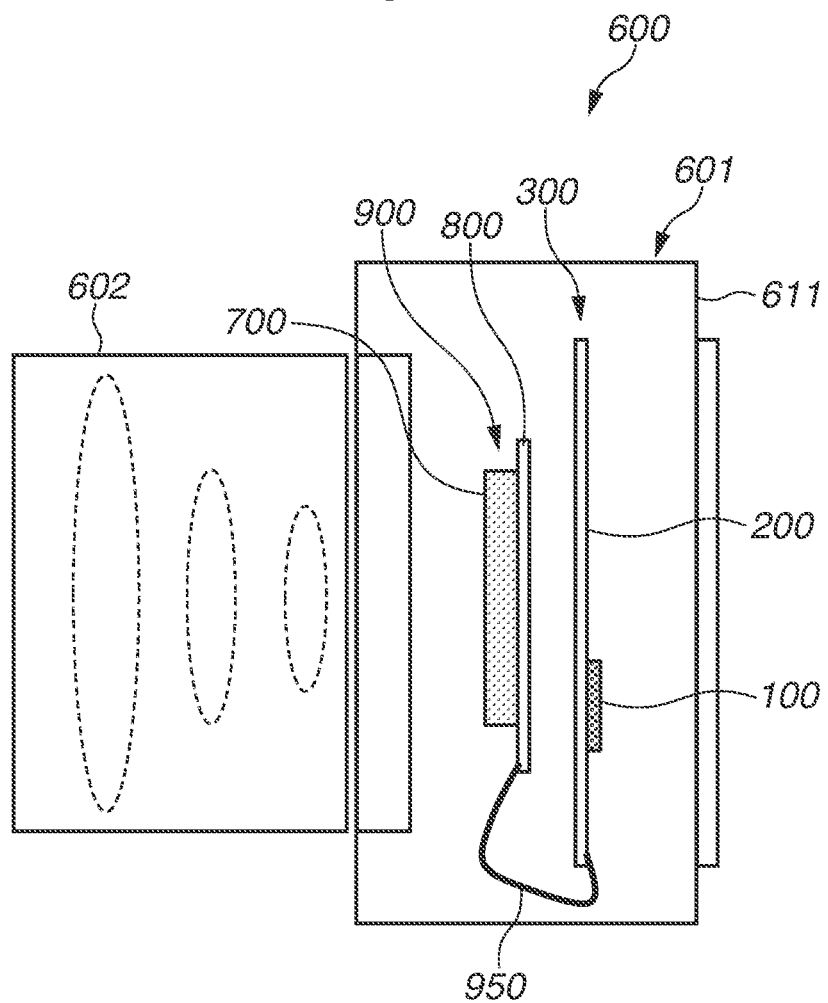

SEMICONDUCTOR MODULE AND ELECTRONIC APPARATUS

BACKGROUND

Field of the Disclosure

The present disclosure relates to a semiconductor module and an electronic apparatus.

Description of the Related Art

Electronic apparatuses, such as mobile apparatuses, include a semiconductor module including a semiconductor device that communicates with another semiconductor device, such as a memory, and a wiring board with the semiconductor device mounted thereon. Since communication speed and a low-voltage trend of the semiconductor device are increasing in the electronic apparatuses, there has been a demand for reducing noise occurring in the semiconductor device.

As a known technique for reducing noise, a bypass capacitor is connected between the power terminal and a ground terminal of the semiconductor device. Japanese Patent Application Laid-Open No. 2020-205409 and WO 2005/024945 disclose techniques for solder-mounting a bypass capacitor as a chip component between a semiconductor device and a wiring board.

SUMMARY

According to an aspect of the present disclosure, a semiconductor module includes a semiconductor device having a first land, a second land, and a third land, a wiring board having a substrate, a fourth land, a fifth land, and a sixth land disposed on the main surface of the substrate, a chip component having a first electrode and a second electrode disposed across a distance in a longitudinal direction and being disposed between the wiring board and the semiconductor device, a first solder joint configured to bond the first land, the fourth land, and the first electrode, a second solder joint configured to bond the second land, the fifth land, and the second electrode, and a third solder joint configured to bond the third land and the sixth land. The volume of the first solder joint and the volume of the second solder joint are each larger than the volume of the third solder joint.

According to another aspect of the present disclosure, a semiconductor module includes a semiconductor device having a first land and a second land, a printed wiring board having an insulating substrate, a solder resist having a plurality of openings and a plurality of guiding portions disposed on a main surface of the insulating substrate, and a fourth land and a fifth land exposed from the plurality of openings disposed on the main surface of the insulating substrate, a chip component having a first electrode and a second electrode disposed across a distance in a longitudinal direction and being disposed between the printed wiring board and the semiconductor device, a first solder joint configured to bond the first land, the fourth land, and the first electrode, a second solder joint configured to bond the second land, the fifth land, and the second electrode, a first conductor pattern extending from the fourth land disposed on the main surface of the insulating substrate in a first direction intersecting with the longitudinal direction of the chip component, and a second conductor pattern extending from the fifth land disposed on the main surface of the insulating substrate in a second direction intersecting with the longitudinal direction of the chip component. The first conductor pattern and the second conductor pattern are each covered by one or more of the plurality of guiding portions of the solder resist.

Further features of the present disclosure will become apparent from the following description of exemplary embodiments with reference to the attached drawings.

BRIEF DESCRIPTION OF THE DRAWINGS

FIG. 1 illustrates an imaging apparatus as an example of an electronic apparatus according to a first exemplary embodiment.

DESCRIPTION OF THE EMBODIMENTS

Figure 2A:
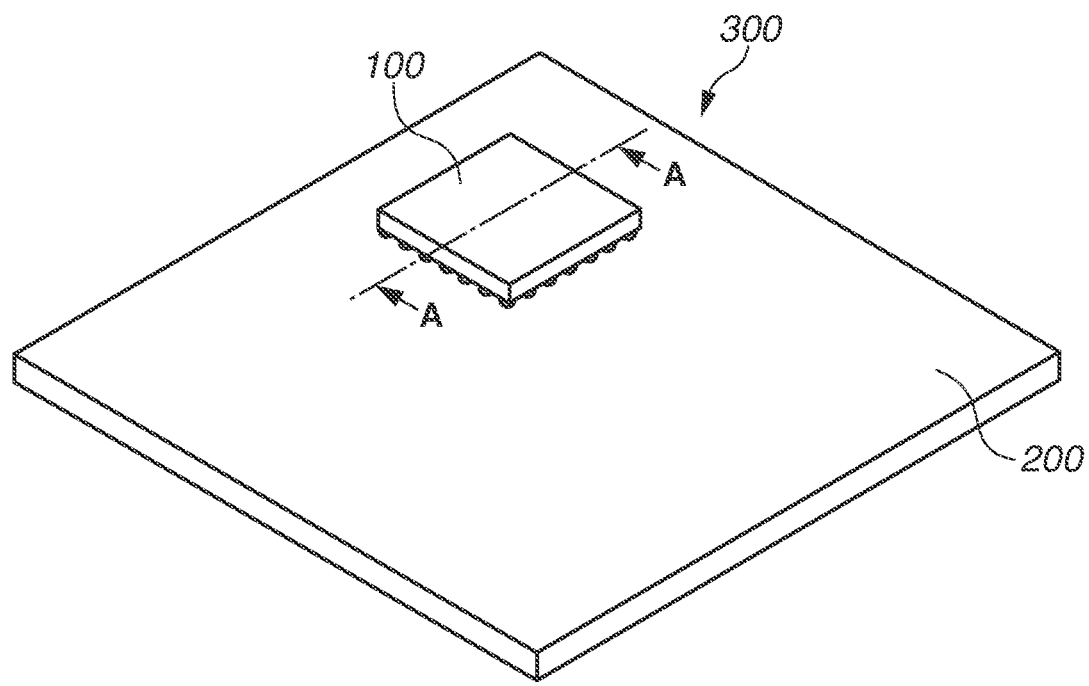
FIG. 2A is a perspective view illustrating a processing module according to the first exemplary embodiment.

Exemplary embodiments of the present disclosure will now be described in detail with reference to the accompanying drawings.

FIG. 1 illustrates a digital camera 600, an imaging apparatus as an example of an electronic apparatus according to a first exemplary embodiment. The digital camera 600 as an imaging apparatus is a lens exchangeable digital camera having a camera main body 601. A lens unit (lens barrel) 602 including a lens is attachable to and detachable from the camera main body 601. The camera main body 601 includes a housing 611, a processing module 300, and a sensor module 900. The processing module 300 and the sensor module 900 are printed circuit boards disposed in the housing 611. The processing module 300 is an example of a semiconductor module. The processing module 300 and the sensor module 900 are electrically connected with each other via a cable 950.

The sensor module 900 includes an image sensor 700 and a printed wiring board 800. The image sensor 700 is mounted on the printed wiring board 800. The image sensor 700 is, for example, a complementary metal oxide semiconductor (CMOS) image sensor or a charge coupled device (CCD) image sensor. The image sensor 700 has a function of converting light incident via the lens unit 602 into an electrical signal.

The processing module 300 includes a semiconductor device 100 and a printed wiring board 200 as a first wiring board. The semiconductor device 100 is mounted on the printed wiring board 200. The printed wiring board 200 is a rigid substrate. The semiconductor device 100 is, for example, a digital signal processor (DSP) having a function of acquiring an electrical signal from the image sensor 700, subjecting the acquired electrical signal to correction processing, and generating image data.

The processing module 300 will now be described with reference to FIGS. 2A to 4.

The semiconductor device 100 is a semiconductor package with an area array. According to the first exemplary embodiment, the semiconductor device 100 is a semiconductor package with a ball grid array (BGA). The semiconductor device 100 includes a semiconductor element 101 and a package substrate 102 as a second printed wiring board. The package substrate 102 is a rigid substrate.

The semiconductor element 101 is mounted on the package substrate 102. The package substrate 102 includes an insulating substrate 120. The insulating substrate 120 has a main surface 121, and a main surface 122 on the side opposite to the main surface 121. The material of the insulating substrate 120 is ceramic such as alumina. The semiconductor element 101 is, for example, a semiconductor chip, and is mounted face up or face down. According to the first exemplary embodiment, the semiconductor element 101 is mounted face down on the main surface 121 of the insulating substrate 120.

Figure 2B:
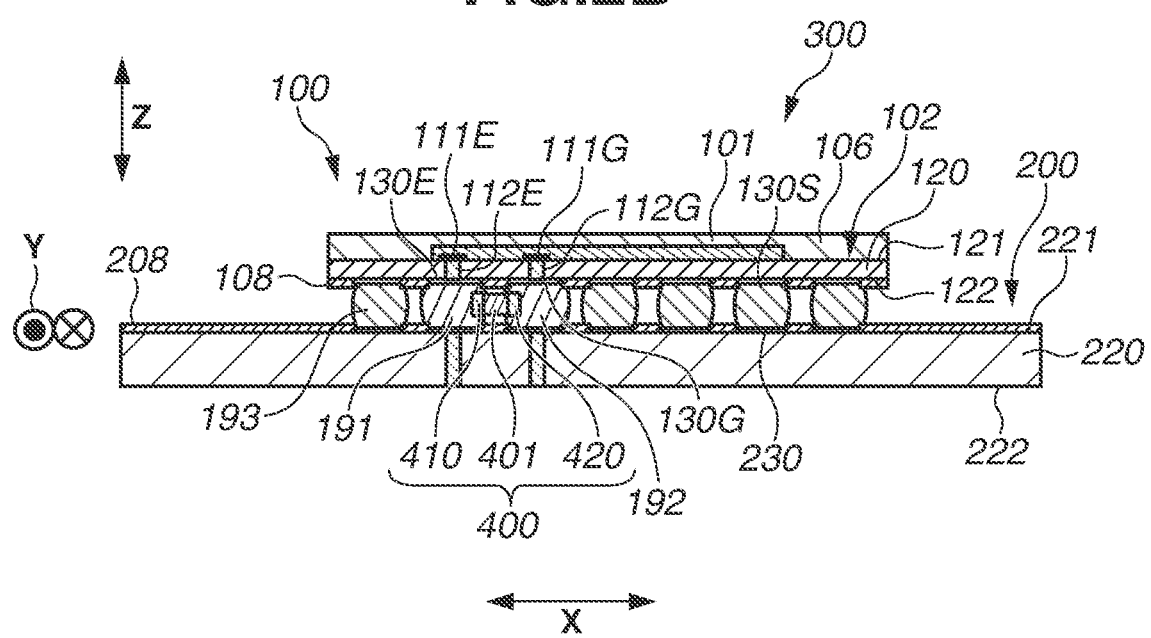
FIG. 2B is a cross-sectional view illustrating the processing module taken along the A-A line illustrated in FIG. 2A.
Figure 3A:
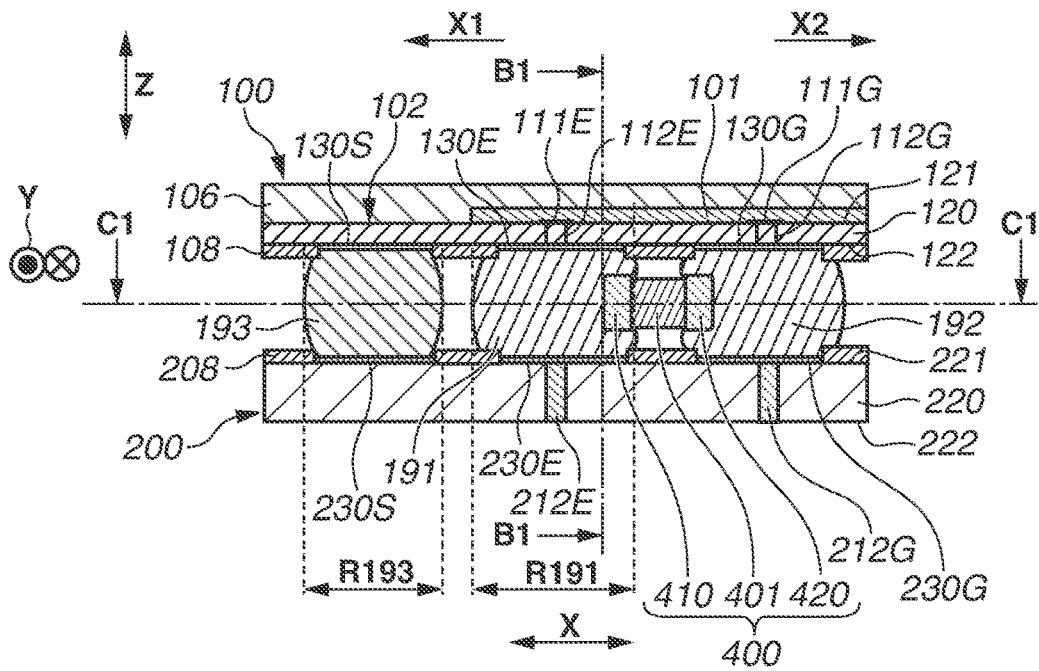
FIG. 3A is a cross-sectional schematic view illustrating a part of the processing module according to the first exemplary embodiment when viewed from the Y direction.
Figure 3B:
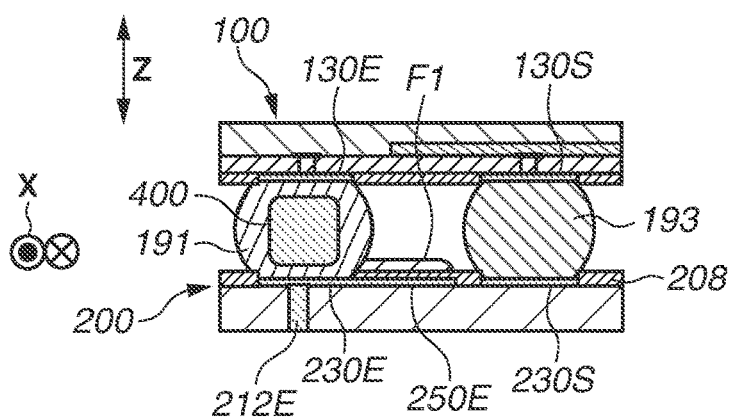
FIG. 3B is a cross-sectional schematic view taken along the B1-B1 line illustrated in FIG. 3A.

The semiconductor element 101 includes a plurality of power terminals, a plurality of ground terminals, and a plurality of signal terminals. Each terminal is bonded to the package substrate 102 by wire bonding or flip-chip bonding (not illustrated). FIGS. 2B, 3A, and 3B illustrate a power terminal 111E as one of the plurality of power terminals, and a ground terminal 111G as one of the plurality of ground terminals. More specifically, the semiconductor element 101 includes the power terminal 111E and the ground terminal 111G.

The main surface 121 of the insulating substrate 120 is provided with a sealing resin 106 that seals the semiconductor element 101. The package substrate 102 includes a plurality of lands 130 disposed on the main surface 122 of the insulating substrate 120.

The plurality of lands 130 is arranged at minimum pitches of 0.7 mm or less. From the viewpoint of high-density land arrangements, it is desirable to arrange the lands 130 at minimum intervals of 0.4 mm or less. However, applicable patterns to be arranged include a lattice form (or a matrix form) and a hatched pattern. The lands 130 include terminals made of a conductive metallic material such as copper and gold. Examples of the lands 130 include signal terminals, power terminals, ground terminals, and dummy terminals. The plurality of lands 130 includes a land 130E as a power terminal, a land 130G as a ground terminal, and lands 130S other than the lands 130E and 130G. The lands 130S may be signal terminals, power terminals, ground terminals, and dummy terminals. The land 130E is a first land, the land 130G is a second land, and the lands 130S include a plurality of third lands. The land 130E as the first land and the land 130G as the second land are adjacent to each other. The lands 130S as the third lands are adjacent to the land 130E as the first land and the land 130G as the second land. The land 130E is electrically connected to the power terminal 111E of the semiconductor element 101 via a via conductor 112E formed on the insulating substrate 120. The land 130G is electrically connected to the ground terminal 111G of the semiconductor element 101 via a via conductor 112G formed on the insulating substrate 120.

A solder resist 108 is disposed on the main surface 122. The solder resist 108 is a film made of a solder resist material. The plurality of lands 130 is respectively exposed from a plurality of openings formed on the solder resist 108. The lands 130 may be either solder mask defined (SMD) lands or non-solder mask defined (NSMD) lands. According to the first exemplary embodiment, the lands 130 are SMD lands. The lands 130 may each be independently formed without using the solder resist 108. Although not illustrated, a heat sink may be disposed on the top face of the semiconductor element 101.

The printed wiring board 200 as a wiring board includes an insulating substrate 220. The insulating substrate 220 includes a main surface 221, and a main surface 222 on the side opposite to the main surface 221. The printed wiring board 200 includes a plurality of lands 230 disposed on the main surface 221 of the insulating substrate 220. The material of the insulating substrate 220 is an insulating material such as epoxy resin. However, the wiring board is not limited to a printed wiring board but may be a semiconductor substrate such as a silicon (Si) substrate.

The plurality of lands 230 includes terminals made of a conductive metallic material such as copper and gold. Examples of the lands 230 include signal terminals, power terminals, ground terminals, and dummy terminals. The material of the insulating substrate 220 is an insulating material such as epoxy resin. The plurality of lands 230 includes a land 230E as a power terminal, a land 230G as a ground terminal, and lands 230S other than the lands 230E and 230G. The lands 230S may be signal terminals, power terminals, ground terminals, or dummy terminals. The land 230E is a fourth land, the land 230G is a fifth land, and the lands 230S include a plurality of sixth lands. The land 230E as the fourth land and the land 230G as the fifth land are adjacent to each other. The lands 230S as the sixth lands are adjacent to the land 230E as the fourth land and the land 230G as the fifth land. The land 230E is electrically connected to a via conductor 212E formed on the insulating substrate 220. The land 230G is electrically connected to a via conductor 212G formed on the insulating substrate 220. A power integrated circuit (IC) (not illustrated) electrically connected to the via conductors 212E and 212G illustrated in FIG. 3B is mounted on the printed wiring board 200. The power IC is capable of supplying power to the semiconductor element 101 of the semiconductor device 100 via first solder joints 191 and second solder joints 192. A power IC (not illustrated) of the printed wiring board 200 may be electrically connected without using the via conductors 212E and 212G. The lands 230S may be electrically connected to signal wirings (not illustrated). The land 230E as the third land, the land 230G as the fourth land, and the lands 230S as the fifth lands are almost the same in size. More specifically, the area of the largest land of the fourth, the fifth, and the sixth lands is less than or equal to 1.1 times the area of the smallest land of the fourth, the fifth, and the sixth lands.

The printed wiring board 200 includes a solder resist 208. The solder resist 208 is a film made of a solder resist material. The solder resist 208 is disposed on the main surface 221. The plurality of lands 230 is respectively exposed from a plurality of openings formed on the solder resist 208. The lands 230 may be either SMD lands or NSMD lands. According to the first exemplary embodiment, the lands 230 are SMD lands. The solder resist 208 may include a plurality of guiding portions 208E and 208G that cover a first conductor pattern 250E and a second conductor pattern 250G (described below), respectively. The function of the guiding portions 208E and 208G will be described below. The printed wiring board 200 does not need to include the solder resist 208. In that case, the plurality of lands 230 may each be independently formed on the main surface 221 of the insulating substrate 220. The openings of the solder resist 208 may expose the lands 230S, 230E, 230G, and the region where a capacitor 400 is disposed.

According to the first exemplary embodiment, the land 230E of the printed wiring board 200 is bonded to the land 130E via the first solder joint 191 formed of solder. The land 230G is bonded to the land 130G via the second solder joint 192 formed of solder. The lands 230S are bonded to the lands 130S via third solder joints 193 formed of solder. Each solder joint may be described as "solder".

The processing module 300 includes the capacitor 400 as an example of an electronic component. The capacitor 400 is a passive component and a chip component. It is desirable that the size of a chip component in a planar view is the 0402 size or smaller, for example the 0402 size (0.4 mm*0.2 mm) or the 0201 size (0.25 mm*0.125 mm). Notations, such as the 0402 size and the 0201 size, conform to the size notation method (based on mm) for electronic components in Japanese Industrial Standard (JIS).

The capacitor 400 includes an element 401 having a nearly rectangular parallelepiped shape extending longitudinally, and a pair of the electrodes 410 and 420 disposed on both sides of the element 401 across a distance in the longitudinal direction. A pair of the electrodes 410 and 420 are fixed to the element 401 across a distance in the longitudinal direction. Referring to FIGS. 2B to 4, the longitudinal direction of the capacitor 400, i.e., the element 401, is the X direction.

The widthwise direction of the capacitor 400, i.e., the element 401, is the Y direction. The Y direction is the width direction orthogonally intersecting with the X direction. The vertical direction of the capacitor 400, i.e., the element 401 is the Z direction. The Z direction is the direction orthogonally intersecting with the X and Y directions. The Z direction is also orthogonal to the main surfaces 121, 122, 221, and 222.

One electrode 410 of a pair of the electrodes 410 and 420 is a first electrode, and the other electrode 420 thereof is a second electrode. The electrodes 410 and 420 each include an underground and a coating film that covers the underground. The material of the coating film of the electrodes 410 and 420 is a conductive metallic material such as tins.

The capacitor 400 is a bypass capacitor. The electrode 410 of the capacitor 400 is connected to the solder joint 191. More specifically, the electrode 410 of the capacitor 400 is electrically connected to the lands 130E and 230E via the solder joint 191. The electrode 420 of the capacitor 400 is connected to the solder joint 192. More specifically, the electrode 420 of the capacitor 400 is electrically connected to the lands 130G and 230G via the solder joint 192.

Figure 4:
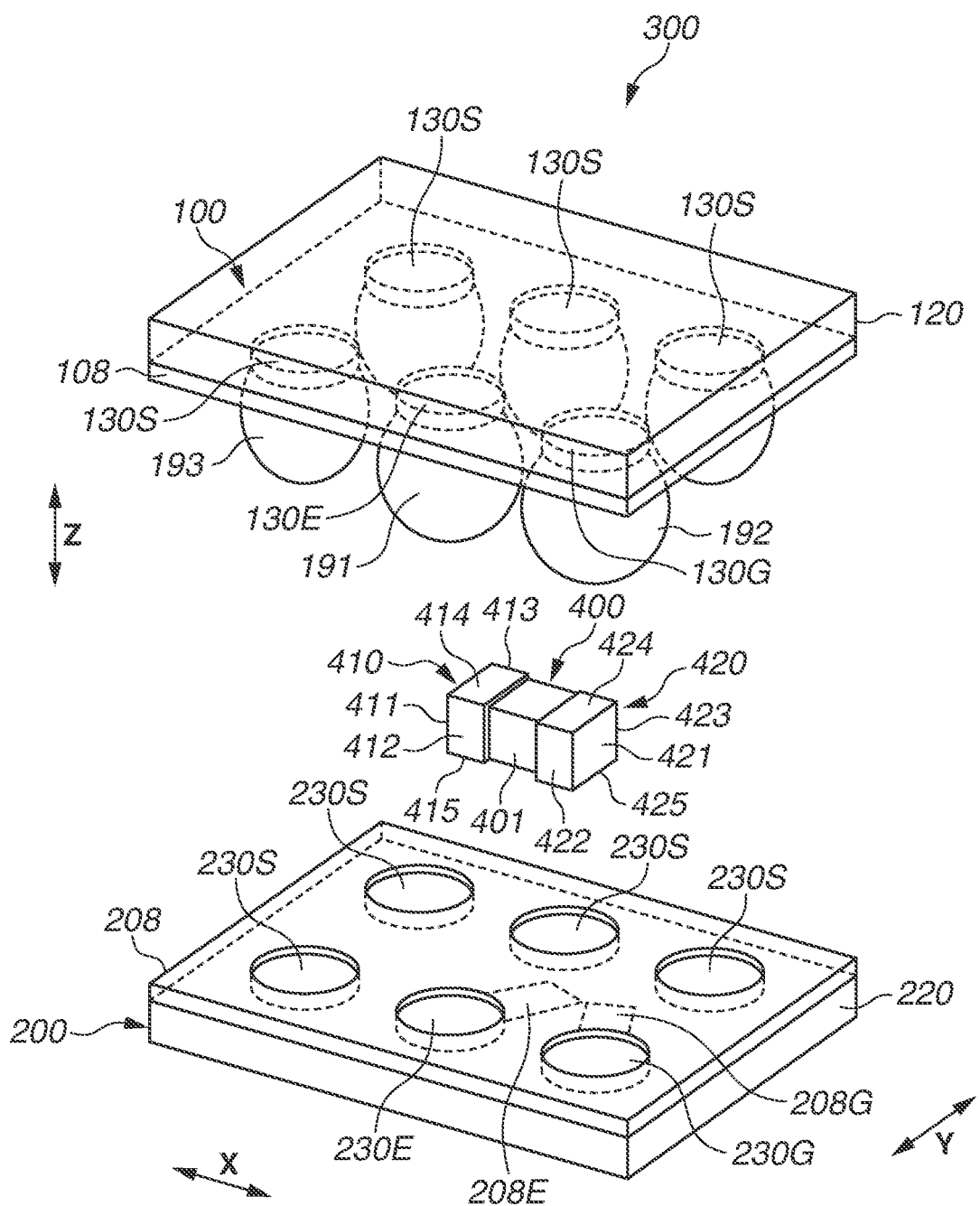
FIG. 4 is an exploded perspective view illustrating the processing module according to the first exemplary embodiment.

As illustrated in FIG. 4, the electrode 410 has three side faces 411, 412, and 413, a top face 414, and a bottom face 415 as electrode surfaces. The side faces 411, 412, and 413, the top face 414, and the bottom face 415 have a rectangular shape when viewed from the direction perpendicular to each surface. Two side faces 412 and 413 out of the three side faces 411, 412, and 413 face each other across a distance in the Y direction. The top face 414 and the bottom face 415 face each other across a distance in the Z direction. The side face 411 is perpendicular to and adjacent to the side faces 412 and 413, the top face 414, and the bottom face 415. The electrode 420 has three side faces 421, 422, and 423, a top face 424, and a bottom face 425 as electrode surfaces. The side faces 421, 422, and 423, the top face 424, and the bottom face 425 have a rectangular shape when viewed from the direction perpendicular to each surface. Two side faces 422 and 423 out of three side faces 421, 422, and 423 face each other across a distance in the Y direction. The top face 424 and the bottom face 425 face each other across a distance in the Z direction. The side face 421 is perpendicular to and adjacent to the side faces 422 and 423, the top face 424, and the bottom face 425. The side face 411 of the electrode 410 and the side face 421 of the electrode 420 are disposed to face each other across a distance in the X direction. The top face 414 of the electrode 410 faces the land 130E of the semiconductor device 100, and the bottom face 415 of the electrode 410 faces the land 230E of the printed wiring board 200. The top face 424 of the electrode 420 faces the land 130G of the semiconductor device 100, and the bottom face 425 of the electrode 420 faces the land 230G of the printed wiring board 200.

Power source noise is generated by the inductance of the wiring between the electrode 410 of the capacitor 400 and the power terminal 111E and the inductance of the wiring between the electrode 420 of the capacitor 400 and the ground terminal 111G. Power source noise is a voltage variation on the power line generated by the operation of the semiconductor device 100. This voltage variation occurs when the power current is changed by the parasitic inductance and resistance on the power line. To reduce power source noise by reducing the inductance of the wiring, it is desirable to dispose the capacitor 400 such that the wiring distance between the power terminal 111E and the ground terminal 111G of the semiconductor device 100 is short. Since the electrode 410 of the capacitor 400 is electrically connected to the land 130E of the semiconductor device 100 via the solder joint 191, the inductance of the wiring between the electrode 410 of the capacitor 400 and the land 130E can be reduced, according to the present disclosure. Since the electrode 420 of the capacitor 400 is electrically connected to the land 130G of the semiconductor device 100 via the solder joint 192, the inductance of the wiring between the electrode 420 of the capacitor 400 and the land 130G can be reduced. The inductance of the wiring decreases to reduce power source noise, thereby achieving high-speed communication in the semiconductor device 100.

Meanwhile, according to Japanese Patent Application Laid-Open No. 2020-205409, a capacitor as a chip component is solder-mounted between a semiconductor device and a wiring board. However, as a result of dedicated consideration by the inventor of the present application, it has been found that the technique disclosed in the above-described document does not provide a sufficient bonding strength between the chip component and solder.

More specifically, no solder ball of the semiconductor device is formed at the position where the chip component is connected. Thus, the volume of the solder joint connected with the electrode of the chip component is smaller than the volume of the solder joint that is connecting the semiconductor device and the wiring board. In the technique disclosed in Japanese Patent Application Laid-Open No. 2020-205409, the chip component sometimes comes off the solder joint when a strong impact, such as a drop test, is applied.

The present disclosure employs a configuration in which the volume of the first solder joint 191 and the volume of the second solder joint 192 are each larger than the volume of each third solder joint 193. The inventor found that adopting such a configuration enables providing a higher bonding strength between the solder joints 191 and 192 and the capacitor 400 than the prior art. If the processing module 300 is applied with a strong impact such as a thermal shock, stress concentrates in the vicinity of the edges of the electrodes 410 and 420 of the capacitor 400. If the volume of the solder joint 191 and the volume of the solder joint 192 are each smaller than the volume of each solder joint 193, at least either one of the electrodes 410 and 420 of the capacitor 400 will come into contact with the land 130 or 230. If stress concentrates in the vicinity of the edges of the electrodes 410 and 420 of the capacitor 400 in this state, a crack is likely to occur in the vicinity of the edges of the electrodes 410 and 420. A crack may degrade the bonding reliability of the solder joints 191 and 192 with the capacitor 400 bonded thereto. In contrast, if the volume of the first solder joint 191 and the volume of the second solder joint 192 are each larger than the volume of each third solder joint 193, stress applied to the edges of the electrode 410 and 420 of the capacitor 400 can be dispersed. Thus, the possibility of occurring of the above-described crack decreases, and the bonding reliability improves.

More desirably, the volume of the first solder joint 191 and the volume of the second solder joint 192 are each more than or equal to 1.2 times the volume of each third solder joint 193. It is desirable that the volume of the first solder joint 191 and the volume of the second solder joint 192 are each less than four time the volume of each third solder joint 193. If the volume of the first solder joint 191 and the volume of the second solder joint 192 are each more than or equal to four times the volume of each third solder joint 193, solder joints cannot be disposed at narrow pitches, and there may be a possibility that the semiconductor device 100 cannot be reduced in size.

It is desirable that the capacitor 400 is disposed across a void with each of the semiconductor device 100 and the printed wiring board 200. It is desirable that the electrode 410 of the capacitor 400 is separated from the land 130E of the semiconductor device 100 and the land 230E of the printed wiring board 200 and that the electrode 420 of the capacitor 400 is separated from the land 130G of the semiconductor device 100 and the land 230G of the printed wiring board 200. More specifically, it is desirable that the difference between the first distance from the capacitor 400 to the semiconductor device 100 and the second distance from the capacitor 400 to the printed wiring board 200 is smaller than the first and the second distances and is close to zero. More specifically, it is desirable that the capacitor 400 is disposed at the centers of the solder joints 191 and 192. If the capacitor 400 is disposed at the center between the solder joints 191 and 192, stress applied to the edges of the electrodes 410 and 420 of the capacitor 400 can be dispersed. This reduces the impact on the capacitor 400, making it possible to further improve the bonding reliability.

As illustrated in FIG. 3A, a maximum length R191 of the solder joint 191 in the X direction is larger than a maximum length R193 of each solder joint 193 in the X direction. However, if the maximum length of the solder joint 191 in the X direction is long, the solder joint 191 may possibly come into contact with the solder joints 193 to cause a short-circuit. Thus, it is desirable that the maximum length of the solder joint 191 in the X direction is twice the maximum length or less of each solder joint 193 in the X direction.

It is desirable that the processing module 300 includes a first chip component guiding path 260E and a second chip component guiding path 260G. The first chip component guiding path 260E and the second chip component guiding path 260G guide the capacitor 400 to the solder joints 191 and 192, respectively, when the processing module 300 is manufactured. WO 2005/024945 discloses a technique of providing a solder paste on a footprint extending in the widthwise direction of the capacitor as a chip component, disposing and heating the capacitor on the solder paste, and guiding and bonding the capacitor up to metal bumps. However, after a consideration by the inventor of the present disclosure, it was found that the technique discussed in WO 2005/024945 may have a difficulty in repetitively disposing the chip component at the same position with favorable reproducibility. According to WO 2005/024945, the foot printing serving as the conductor pattern according to the present embodiment is exposed on a substrate, and a step is generated between a land and the substrate surface. The chip component may therefore be caught by the step and then widthwisely rotated. If the chip component is bonded while rotating, a unique point occurs where stress is concentrated after the bonding, resulting in an insufficient bonding strength.

The first chip component guiding path 260E as a first component guiding path includes the first conductor pattern 250E, and the guiding portion 208E of the solder resist for covering the first conductor pattern 250E.

The first conductor pattern 250E extends from the land 230E disposed on the main surface 221 of the insulating substrate 220, in a first direction intersecting with the longitudinal direction of the capacitor 400. The length in the Y direction is larger than a half of the widthwise length of the capacitor 400 and is shorter than the shortest distance between the land 230E as the third land and the lands 230S as the fifth lands. The first conductor pattern 250E is out of contact with the lands 230G and 230S. The first conductor pattern 250E is not directly connected with a wiring (not illustrated).

The second chip component guiding path 260G as the second component guiding path includes the second conductor pattern 250G, and the guiding portion 208G of the solder resist for covering the second conductor pattern 250G.

The second conductor pattern 250G extends from the land 230G disposed on the main surface 221 of the insulating substrate 220, in a second direction intersecting with the longitudinal direction of the capacitor 400. The length in the Y direction is larger than a half of the widthwise length of the capacitor 400 and is shorter than the shortest distance between the land 230G as the fourth land and the lands 230S as the fifth lands. The second conductor pattern 250G is out of contact with the lands 230E and 230S. The second conductor pattern 250G is not directly connected with a wiring (not illustrated).

The first conductor pattern 250E extends from the land 230E in a direction approaching the second conductor pattern 250G. However, the first conductor pattern 250E and the second conductor pattern 250G may extend in parallel. This means that the first and the second directions may be the same. The first conductor pattern 250E and the second conductor pattern 250G are formed of a conductive metallic material, e.g., copper or gold. Although the first conductor pattern 250E and the second conductor pattern 250G have a rectangular shape when viewed in the Z direction, the present disclosure is not limited thereto. These conductor patterns may have any shape, such as a polygon shape, circular shape, and elliptic shape.

When bonding the capacitor 400 as a chip component with the first solder joint 191 and the second solder joint 192, the first chip component guiding path 260E and the second chip component guiding path 260G guide the capacitor 400 to the bonding portion. Solder pastes are placed on the guiding portions 208E and 208G, and the capacitor 400 is disposed on the solder pastes. When the solder pastes are heated and melted, the capacitor 400 is guided to the bonding portion.

Figure 3C:
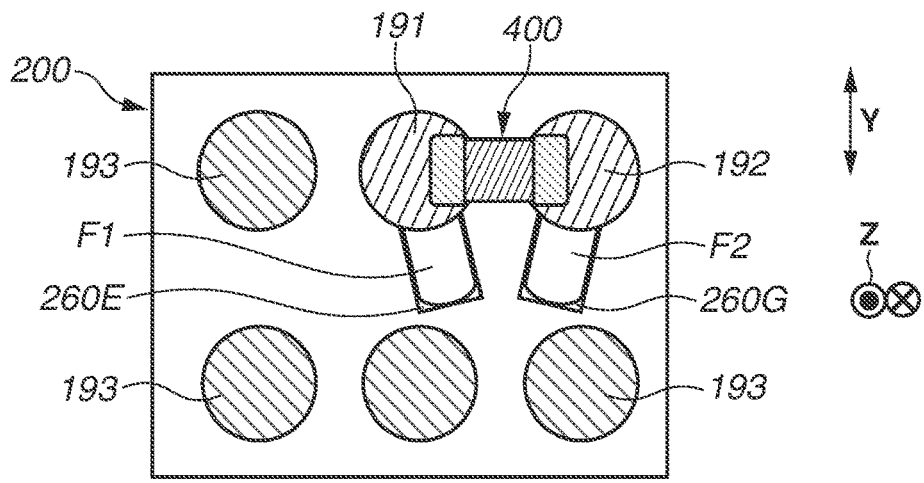
FIG. 3C is a cross-sectional schematic view taken along the C1-C1 line illustrated in FIG. 3A.

In the first chip component guiding path 260E and the second chip component guiding path 260G, the first conductor pattern 250E and the second conductor pattern 250G are covered by the guiding portions 208E and 208G of the solder resist, respectively. Adopting this configuration enables horizontally moving the mounted capacitor 400 while maintaining its orientation. This is because there arises no step until the capacitor 400 is guided from the first chip component guiding path 260E and the second chip component guiding path 260G to the bonding portion. As a result, the center line connecting the centers of the solder joints 191 and 192 and the longitudinal center line of the capacitor 400 are positioned on the same line, as illustrated in FIG. 3C, to facilitate bonding.

It is desirable that the length of the first conductor pattern 250E and the length of the second conductor pattern 250G are each larger than a half of the widthwise length of the capacitor 400. This enables placing sufficient amounts of solder pastes to stably guide the capacitor 400. It is desirable that the first conductor pattern 250E extends from the land 230E in a direction approaching the second conductor pattern 250G. By mounting the first conductor pattern 250E and the second conductor pattern 250G in such a way, these patterns can be further extended. It is also desirable that the width of the first conductor pattern 250E and the width of the second conductor pattern 250G are each at least the width of the electrode of the capacitor 400. This prevents the capacitor 400 from falling off the guiding paths and enables stably moving the capacitor 400. The width of the electrode of the capacitor 400 is the length of the bottom face 415 of the capacitor 400 or the length of the bottom face 425 of the capacitor 400, in the X direction in FIG. 4.

When the above-described process for heating and melting solder pastes is performed, a flux F1 remains on the guiding portion 208E, and a flux F2 on the guiding portion 208G. It is desirable that the fluxes F1 and F2 are provided only on the guiding portions 208E and 208G, respectively. This is intended to prevent an ion migration phenomenon that occurs when fluxes remaining on the guiding paths come into contact with each other or come into contact with a neighboring flux.

The above-described disclosure can provide a semiconductor module having a sufficient bonding strength between solder and a capacitor to a further extent than the prior art. The above-described disclosure can also provide a semiconductor module in which the layout of the bypass capacitor is controlled with a high accuracy.

(Processing Module Manufacturing Method 1)

A method of manufacturing a processing module 300 will now be described. FIGS. 5A to 5D and 6A to 6C illustrate the method of manufacturing the processing module 300 according to a first exemplary embodiment. A side view and a top view are illustrated for each step.

Figure 5A:
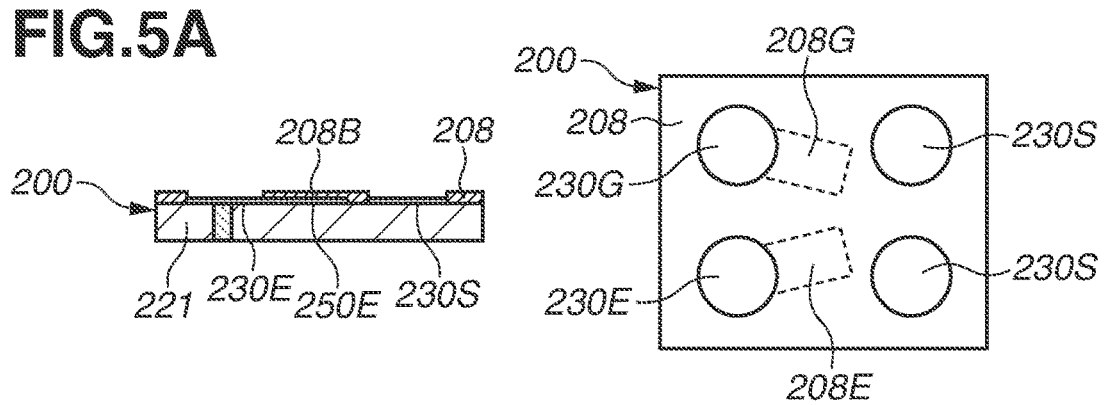
FIGS. 5A to 5D illustrate a method of manufacturing the processing module according to the first exemplary embodiment.

As illustrated in FIG. 5A, a printed wiring board 200 is prepared (Step S1). The printed wiring board 200 includes the lands 230E, 230G, and 230S, the first conductor pattern 250E, the second conductor pattern 250G, and the solder resist 208 on the main surface 221. The solder resist 208 is provided with the guiding portions 208E and 208G, and a plurality of openings. The lands 230E, 230G, and 230S are exposed from the openings of the solder resist 208. In step S1, the semiconductor device 100 and the capacitor 400 are prepared.

Figure 5B:
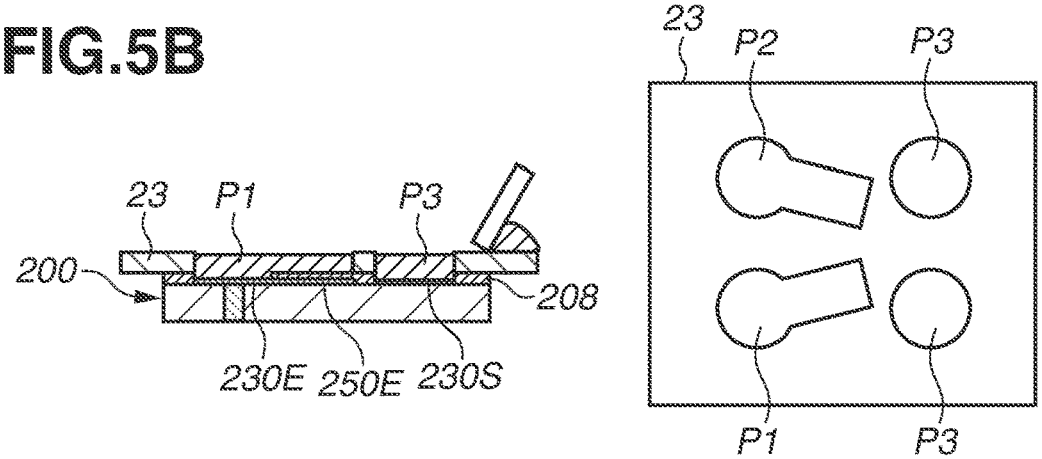

As illustrated in FIG. 5B, a solder paste P1 as a first solder paste, a solder paste P2 as a second solder paste, and solder pastes P3 as third solder pastes are supplied across a distance between them on the printed wiring board 200 (Step S2).

The solder paste P1 is supplied onto the land 230E as the third land and the guiding portion 208E. The solder paste P2 is supplied onto the land 230G as a fourth land and the guiding portion 208G. The solder pastes P3 are supplied onto the lands 230S as fifth lands.

The solder pastes P1, P2 and P3 contain solder powder and flux components used for soldering. Although, in the present disclosure, the solder pastes P1, P2 and P3 are made of the same material, the solder pastes may not be made of the same material as long as the temperatures of their melting points are close. In step S2, the solder pastes P1, P2 and P3 are supplied to the printed wiring board 200 through screen printing using a metal mask 23. The method for supplying the solder pastes P1, P2, and P3 is not limited thereto. For example, a dispenser may be used.

Figure 5C:
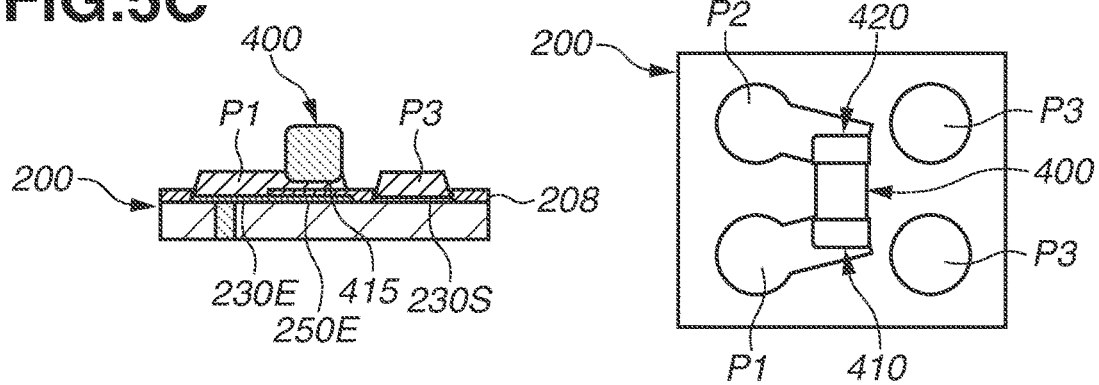

As illustrated in FIG. 5C, the capacitor 400 is mounted such that the electrode 410 comes into contact with the solder paste P1 on the guiding portion 208E, and the electrode 420 comes into contact with the solder paste P2 on the guiding portion 208G. More specifically, on the solder pastes P1 and P2 provided on the guiding portions 208E and 208G, the capacitor 400 is mounted in the vicinity of the tips in a direction away from the lands 230E and 230G, respectively (Step S3). Thus, the bottom face 415 of the electrode 410 comes into contact with the solder paste P1, and the bottom face 425 of the electrode 420 comes into contact with the solder paste P2. In step S3, the capacitor 400 is mounted on the solder pastes P1 and P2 by using a mounter (not illustrated).

Figure 5D:
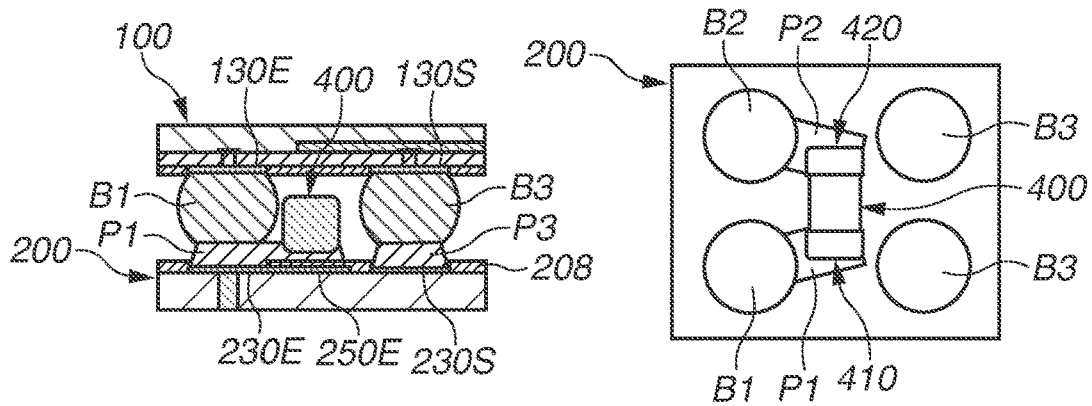

As illustrated in FIG. 5D, the semiconductor device 100 is mounted on the printed wiring board 200 so that the land 130E faces the land 230E, and the land 130G faces the land 230G (Step S4). In step S4, the semiconductor device 100 is mounted on the printed wiring board 200 by using a mounter (not illustrated). In this case, the mounting position of the semiconductor device 100 is adjusted such that the land 130E faces the land 230E, the land 130G faces the land 230G, and the lands 130S face the lands 230S. The lands 130E, 130G, and 130S of the semiconductor device 100 are provided with solder balls B1, B2, and B3, respectively. Thus, the semiconductor device 100 is mounted on the printed wiring board 200 such that the solder balls B1, B2, and B3 face the lands 230E, 230G, and 230S, respectively. In step S4, when the semiconductor device 100 is mounted on the printed wiring board 200, the solder balls B1, B2, and B3 come into contact with the solder pastes P1, P2, and P3, respectively. In step S4, the positional relations between the printed wiring board 200, the capacitor 400, and the semiconductor device 100 are as illustrated in FIG. 5D when viewed from the Z direction. The lands 130E, 130G, and 130S of the semiconductor device 100 are each partly or entirely overlapped with the lands 230E, 230G, and 230S of the printed wiring board 200, respectively, when viewed from the Z direction. When the semiconductor device 100 is mounted, the capacitor 400 is mounted at a position that is out of contact with the solder balls B1 and B2. The top view in FIG. 5D illustrates only the solder balls B1, B2, and B3 out of the configurations of the semiconductor device 100.

Then, in a state where the semiconductor device 100 and the capacitor 400 are mounted on the printed wiring board 200, these components are conveyed to a reflow furnace (not illustrated). In step S5 illustrated in FIG. 6A, the temperature of the atmosphere in the reflow furnace is adjusted to the temperature of the melting point of the solder powder or higher, and then the solder pastes P1, P2, and P3 and the solder balls B1, B2, and B3 are heated and melted. When the solder paste P1 and the solder ball B1 are melted, a fluid molten solder M1 is formed. When the solder paste P2 and the solder ball B2 are melted, a fluid molten solder M2 is formed. When the solder pastes P3 and the solder balls B3 are melted, fluid molten solders M3 are formed.

Figure 6A:
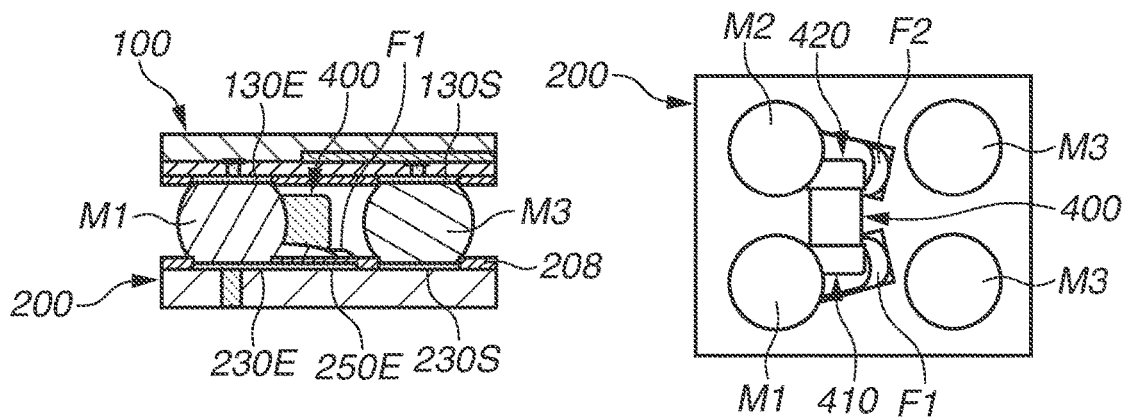
FIGS. 6A to 6C illustrate a method of manufacturing the processing module according to the first exemplary embodiment.
Figure 6B:
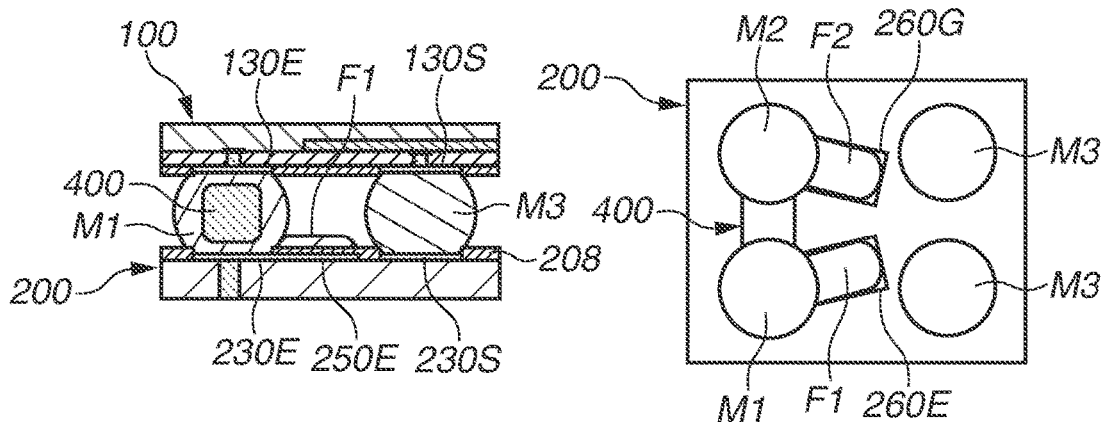

In step S6 illustrated in FIG. 6B, following step S5, heating is continued to fluidize the molten solders M1 and M2. The molten solders M1 and M2 on the guiding portions 208E and 208G are agglomerated on the lands 230E and 230G, respectively. Thus, the capacitor 400 mounted on the guiding portions 208E and 208G reaches the lands 230E and 230G through the agglomeration of the molten solders M1 and M2, respectively. When the capacitor 400 reaches the lands 230E and 230G, the capacitor 400 is raised in an upper direction approaching the semiconductor device 100 by the force received from the molten solders M1 and M2, respectively.

As a result, the distance between the top face 414 of the electrode 410 and the 130E decreases, and the distance between the top face 424 of the electrode 420 and the land 130G also decreases. More specifically, the element 401 of the capacitor 400 is disposed across a void with each of the semiconductor device 100 and the printed wiring board 200. Then, the fluxes F1 and F2 contained in the solder pastes P1 and P2 remain on the chip component guiding paths 260E and 260G, respectively.

Figure 6C:
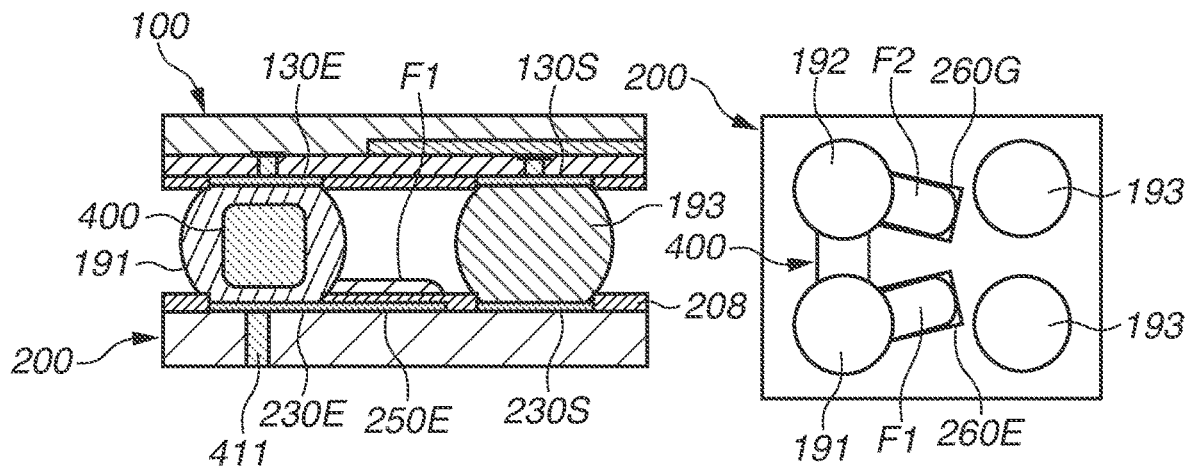

Thereafter, the molten solders M1, M2, and M3 are cooled for solidification. As illustrated in FIG. 6C, the solder joint 191 as the first solder joint is formed where the lands 130E and 230E and the electrode 410 are bonded with solder. The solder joint 192 as the second solder joint is formed where the lands 130G and 230G and the electrode 420 are bonded with solder. The solder joints 193 as the third solder joints are formed where the lands 130S and 230S are bonded with solder. In this case, the volume of the solder joint 191 and the volume of the solder joint 192 are each larger than the volume of each solder joint 193. Although the solder balls B1, B2, and B3 are fixed in size, the paste P1 placed on the guiding portion 208E adheres to the solder ball B1 and then solidifies, and the paste P2 placed on the guiding portion 208G adheres to the solder ball B2 and then solidifies. More specifically, the volumes of the solder joints 191 and 192 can be controlled by the amounts of the solder pastes P1 and P2 to be placed on the guiding portions 208E and 208G, respectively. The processing module 300 illustrated in FIGS. 3A to 3C is manufactured by the above-described processes.

Subsequently, the camera main body 601, i.e., the digital camera 600, is manufactured by storing the processing module 300 in the housing 611 illustrated in FIG. 1.

The manufacturing method according to the present disclosure makes it possible to manufacture the processing module 300 in which the volume of the solder joint 191 and the volume of the solder joint 192 for bonding the capacitor 400 are each larger than the volume of each solder joint 193 for bonding the semiconductor device 100 and the wiring board 200. The manufacturing method of the present disclosure can therefore provide a semiconductor module having a sufficient bonding strength between solder and the capacitor 400 to a further extent than the prior art. The capacitor 400 as a chip component is guided to the bonding portion by the first chip component guiding path 260E and the second chip component guiding path 260G. The manufacturing method of the present disclosure can thus provide a semiconductor module manufacturing method that enables controlling the layout of the bypass capacitor with higher accuracy than the prior art. The capacitor 400 is disposed across a void with each of the semiconductor device 100 and the printed wiring board 200. Thus, bonding is made in a solder bonding form that is axisymmetric with reference to the straight line connecting the centers of the solder joints 191 and 192. This improves the bonding reliability of the processing module 300 since no unique point occurs where stress is concentrated after the bonding.

(Processing Module Manufacturing Method 2)

A second method of manufacturing a processing module as a modification of the above-described manufacturing method will now be described. FIGS. 7A to 7D and 8A to 8C illustrate a method of manufacturing a processing module 300A. The processing module 300A differs from the processing module 300 in that the printed wiring board 200 is not provided with the first chip component guiding path 260E and the second chip component guiding path 260G.

Figure 7A:
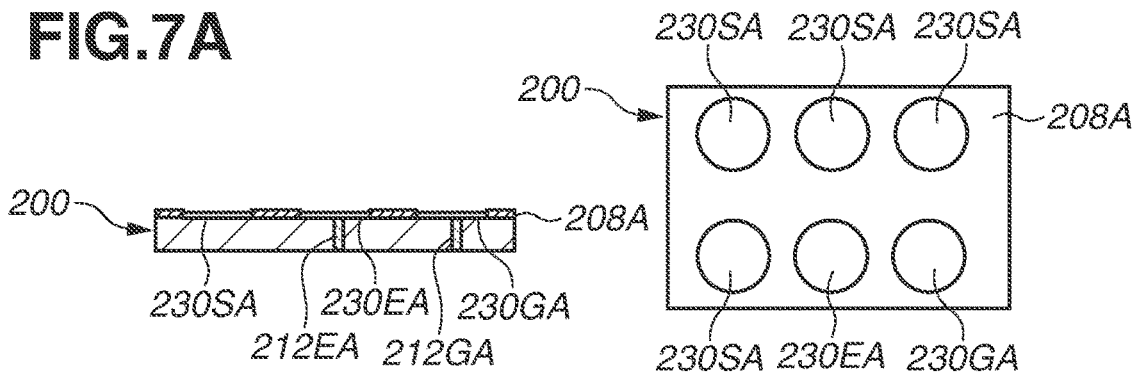
FIGS. 7A to 7D illustrate a method of manufacturing the processing module according to the first exemplary embodiment.

As illustrated in FIG. 7A, a printed wiring board 200 is prepared (Step S11). The printed wiring board 200 includes lands 230EA, 230GA, and 230SA, and the solder resist 208 having a plurality of openings on the main surface 221A. The lands 230E, 230G, and 230S are exposed from the openings of the solder resist 208. In step S11, the semiconductor device 100 and the capacitor 400 are prepared. On the semiconductor device 100, the solder balls B1, B2, and B3 as ball terminals are attached to the lands 130E, 130G, and 130S, respectively, in advance so that the center of each solder ball coincides with the center of each land 230. According to the present exemplary embodiment, it is desirable that the solder balls B1, B2, and B3 are the same in size and material. However, the solder balls are not limited to the same size and the same material as long as the temperatures of their melting points are close.

Figure 7B:
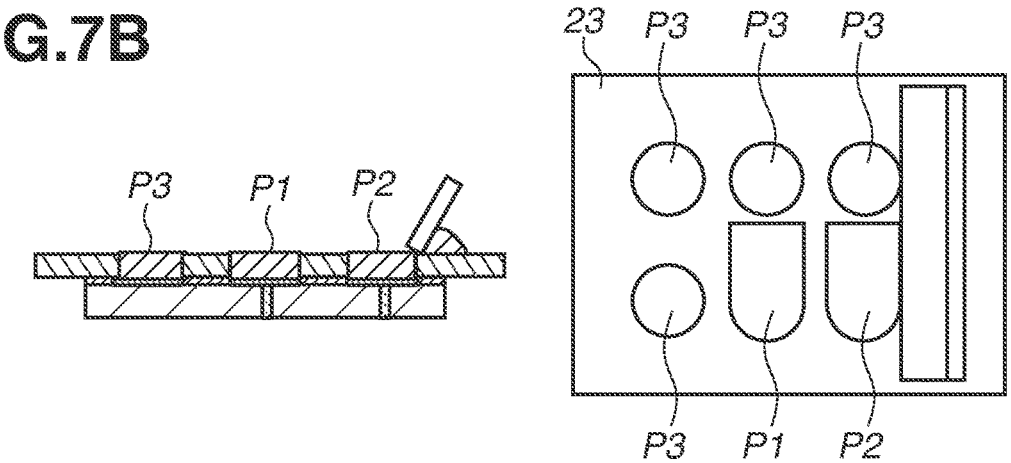

As illustrated in FIG. 7B, the solder paste P1 as the first solder paste, the solder paste P2 as the second solder paste, and the solder pastes P3 as the third solder pastes are supplied across a distance between them on the printed wiring board 200 (Step S12).

The solder paste P1 extends from the land 230E as the fourth land, and is also supplied onto the solder resist 208. The solder paste P2 is also supplied onto the solder resist 208 extending from the land 230GA as the fifth land. The solder pastes P3 are supplied onto the lands 230A as the sixth lands.

The solder pastes P1, P2, and P3 contain solder powder and flux components used for soldering. In the present disclosure, the solder pastes P1, P2, and P3 are made of the same material. However, the solder pastes do not need to be made of the same material as long as the temperatures of their melting points are close. In step S2, the solder pastes P1, P2 and P3 are supplied to the printed wiring board 200 through screen printing using a metal mask 23. The method of supplying the solder pastes P1, P2, and P3 is not limited thereto. For example, a dispenser may be used.

The volumes of the solder joints 191 and 192 are controllable by using the amounts of the solder pastes P1 and P2.

Figure 7C:
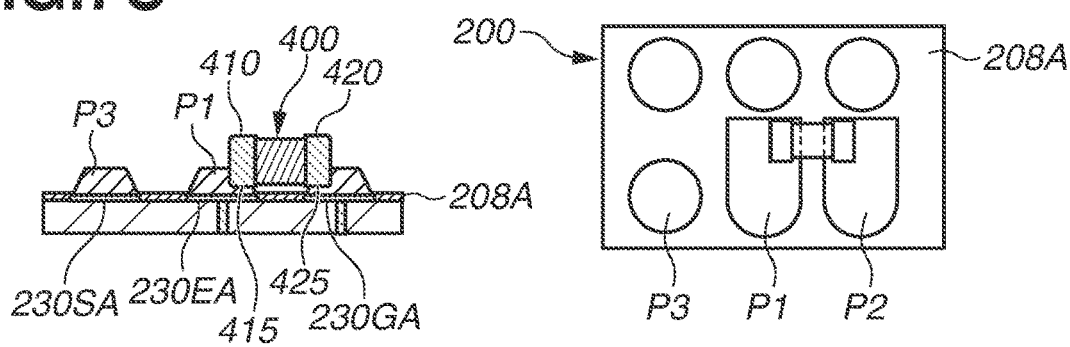

The capacitor is then mounted such that the electrodes 410 and 420 come into contact with the solder pastes P1 and P2, respectively (Step S13), as illustrated in FIG. 7C. The bottom face 415 of the electrode 410 thereby comes into contact with the solder paste P1, and the bottom face 425 of the electrode 420 comes into contact with the solder paste P2. In step S13, the capacitor 400 is mounted on the solder pastes P1 and P2 by using a mounter (not illustrated).

Figure 7D:
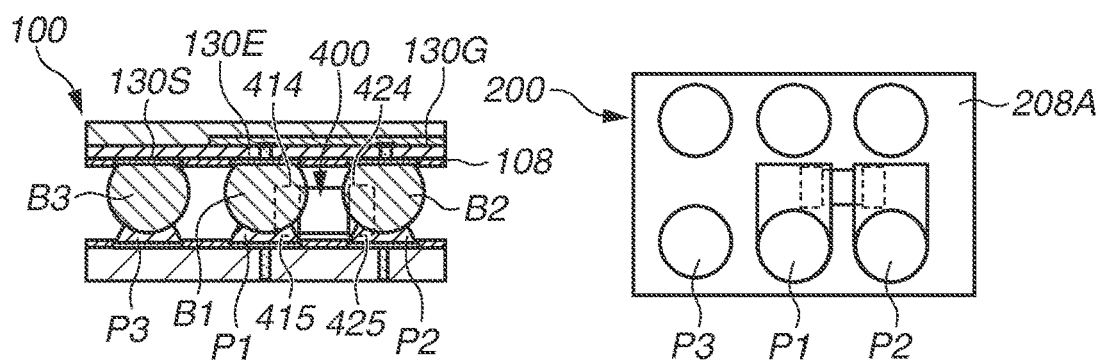

The semiconductor device 100 is then mounted on the printed wiring board 200 so that the lands 130S face the lands 230SA, the land 130E faces the land 230EA, and the land 130G faces the land 230GA (Step S14). In step S14, the semiconductor device 100 is mounted on the printed wiring board 200 by using a mounter (not illustrated). In this case, the mounting position of the semiconductor device 100 is adjusted such that the land 130E faces the land 230EA, the land 130G faces the land 230GA, and the lands 130S face the lands 230SA. The lands 130E, 130G, and 130S of the semiconductor device 100 are provided with the solder balls B1, B2, and B3, respectively. Thus, the semiconductor device 100 is mounted on the printed wiring board 200 such that the solder ball B1 faces the land 230EA, the solder ball B2 faces the land 230GA, and the solder balls B3 face the lands 230SA. In step S14, when the semiconductor device 100 is mounted on the printed wiring board 200, the solder balls B1, B2, and B3 come into contact with the solder pastes P1, P2, and P3, respectively. In step S14, the positional relations between the printed wiring board 200, the capacitor 400, and the semiconductor device 100 are as illustrated in FIG. 7D when viewed from the Z direction. The lands 130E, 130G, and 130S of the semiconductor device 100 are each partially or entirely overlapped with the lands 230EA, 230GA, and 230SA of the printed wiring board 200, respectively, when viewed from the Z direction. When the semiconductor device 100 is mounted, the capacitor 400 is mounted at a position that is out of contact with the solder balls B1 and B2.

These components are then conveyed to a reflow furnace (not illustrated) in a state where the semiconductor device 100 and the capacitor 400 are mounted on the printed wiring board 200. In step S15 illustrated in FIG. 8A, the temperature of the atmosphere in the reflow furnace is adjusted to the temperature of the melting point of the solder powder or higher, and then the solder pastes P1, P2, and P3 and the solder balls B1, B2, and B3 are heated and melted.

When the solder paste P1 and the solder ball B1 are melted, a fluid molten solder M191 is formed as a result of agglomeration. When the solder paste P2 and the solder ball B2 are melted, a fluid molten solder M192 is formed as a result of agglomeration. When the solder pastes P3 and the solder balls B3 are melted, fluid molten solders M193 are formed as a result of agglomeration.

In this case, there is a relation W1>W2, where W1 denotes the solder wettability on the lands 230EA and 230G of the printed wiring board 200, and W2 denotes the solder wettability on the solder resist 208 of the printed wiring board 200. Thus, the solder paste P1 on the solder resist 208 is agglomerated toward the solder paste P1 and the solder ball B1 between the lands 130E and 230EA having the best solder wettability, and then is integrally formed as the molten solder M191. The solder paste P2 on the solder resist 208 is agglomerated toward the solder paste P2 between the lands 130G and 230E having the highest solder wettability, and then is integrally formed as the molten solder M192.

There is a relation W3>W2, where W3 denotes the solder wettability on the electrode surfaces 411, 412, 413, 414, 415, 421, 422, 423, 424, and 425 of the capacitor 400. Thus, the solder pastes melted on the electrode surfaces 411, 412, 413, 414, 415, 421, 422, 423, 424, and 425 of the capacitor 400 get wet, and are covered by solder. Since the electrodes 410 and 420 of the capacitor 400 are covered by solder, the capacitor 400 moves in the Y1 direction of the lands 230EA and 230GA with the flows of the solder pastes P1 and P2. Then, the electrodes 410 and 420 of the capacitor 400 are brought in by the molten solders M191 and M192.

The volume of the molten solder M191 and the volume of the molten solder M192 each become larger than the volume of each molten solder M193 by the volume of agglomeration of the solder pastes P1 and P2, respectively.

Figure 8A:
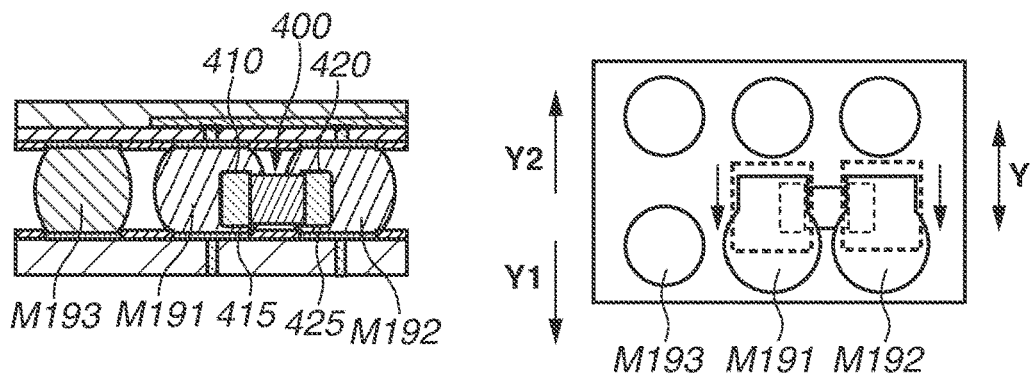
FIGS. 8A to 8C illustrate a method of manufacturing the processing module according to the first exemplary embodiment.
Figure 8B:
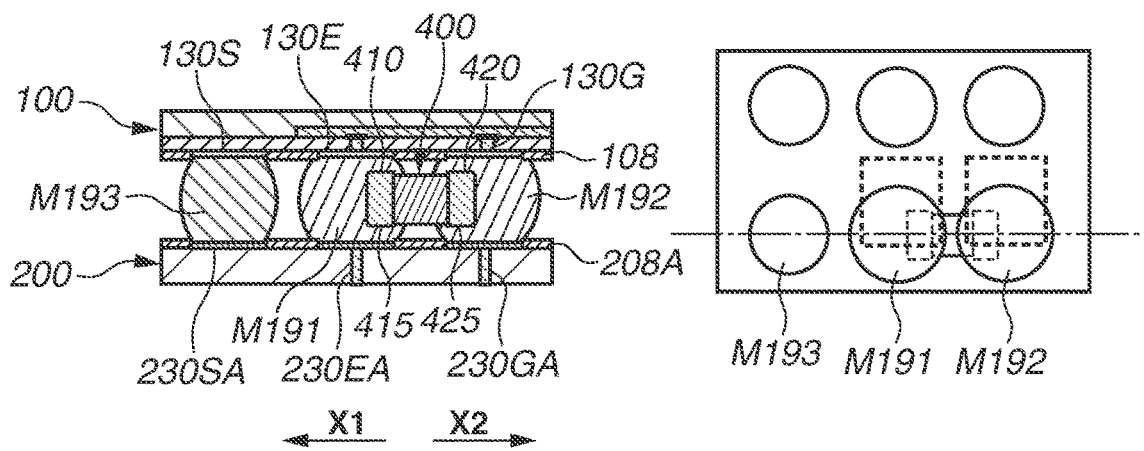

In step S16 illustrated in FIG. 8B, following step S15, heating is continued to further fluidize the molten solders M191, M192, and M193 to make the solders spherical. When the molten solders become spherical, the electrodes 410 and 420 of the capacitor 400 are induced in the X1 and X2 directions at the solder joints 191 and 192, respectively, by a substantially equal force. Thus, the capacitor 400 is subjected to self-alignment to the vicinity of the centers of the solder joints 191 and 192 in the X and Y directions. Also, the electrodes 410 and 420 are induced in the X1 and X2 directions at the solder joints 191 and 192, respectively, by a substantially equal force and, at the same time, are also induced in the Z1 and Z2 directions at the solder joints 191 and 192, respectively, by a substantially equal force. Thus, a void is formed between the capacitor 400 and the semiconductor device 100 and between the capacitor 400 and the printed wiring board 200.

When the solder volume is large and the solder shape is close to sphericity, the difference between the first distance from the capacitor 400 to the semiconductor device 100 and the second distance from the capacitor 400 to the printed wiring board 200 is smaller than the first and the second distances and is close to zero. In other words, the capacitor 400 can be disposed at the centers of the solder joints 191 and 192.

Figure 8C:
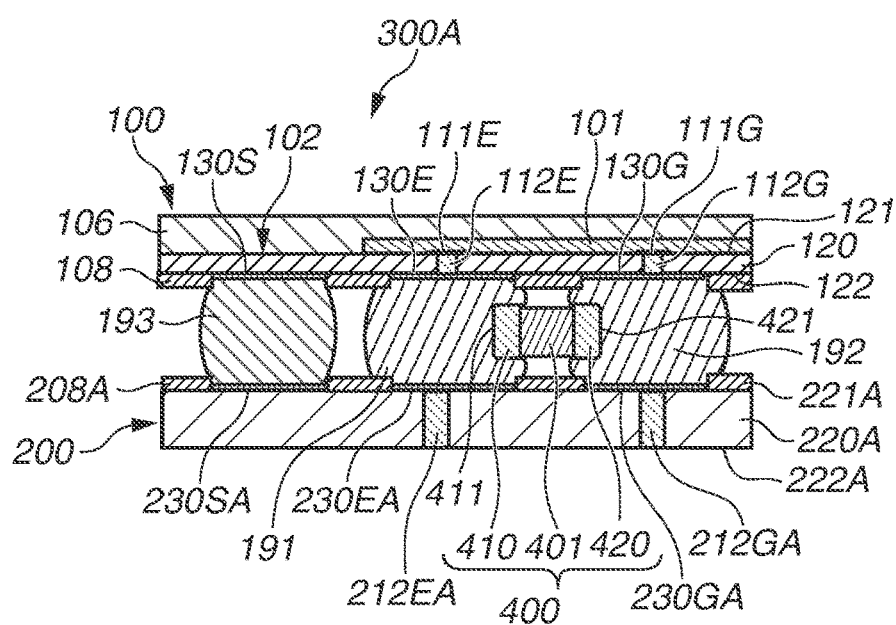

Subsequently, the molten solders M191, M192, and M193 are cooled for solidification. As illustrated in FIG. 8C, the solder joint 191 is formed where the land 130E, the electrode 410, and the land 230EA are bonded with solder. The solder joint 192 is formed where the land 130G, the electrode 420, and the land 230GA are bonded with solder. The solder joints 193 are formed where the lands 130S and 230SA are bonded with solder. The processing module 300A is manufactured by the above-described processes.

Thereafter, the processing module 300A is stored in the housing 611 illustrated in FIG. 1, and the camera main body 601, i.e., the digital camera 600, is manufactured.

The manufacturing method of the present disclosure makes it possible to manufacture the processing module 300 in which the volume of the solder joint 191 and the volume of the solder joint 192 for bonding the capacitor 400 are each larger than the volume of each solder joint 193 for bonding the semiconductor device 100 and the wiring board 200. The manufacturing method of the present disclosure can therefore provide a semiconductor module having a sufficient bonding strength between solder and the capacitor 400 to a further extent than the prior art.

A first sample corresponding to the first exemplary embodiment will now be described. On the semiconductor device 100 illustrated in FIG. 8C, the minimum pitch between the solder balls B as two adjacent ball terminals before the bonding was 0.4 mm (millimeters). The size of the solder balls B was φ0.25 mm. The material of the land 130 was Cu. The material of the solder balls B was Sn-3.0% Ag0.5% Cu. The area of the capacitor 400 when viewed from the Z direction was 0.2 mm*0.1 mm. The capacitor 400 was a chip component of the 0201 size.

The size of the lands 130E and 130G on the semiconductor device 100 was φ0.22 mm when viewed from the Z direction. The size of the lands 230E and 230G on the printed wiring board 200 when viewed from the Z direction was φ0.22 mm which was the same as the size of the lands 130E and 130G. The pitch of the lands 230 was 0.4 mm.

In step S12 illustrated in FIG. 7B, the solder pastes P1 and P2 were 0.22 mm in width, and were extended from the solder paste on the lands 230E and 230G to the length of 0.25 mm. The thickness of a metal mask 23 was 0.08 mm decided based on the minimum pitch between the solder balls B as two adjacent ball terminals before bonding and the size of the capacitor 400 on the semiconductor device 100.

The solder pastes P1, P2, and P3 were made of a material containing solder powder of Sn-3.0% Ag0.5% Cu and a flux component.

In steps S15 and S16 illustrated in FIGS. 8A and 8B, respectively, the peak temperature of the atmosphere in the reflow furnace was set to 230° C. or higher to melt the solder balls B1, B2, and B3 and the solder pastes P1, P2, and P3. Subsequently, the molten solders M191, M192, and M193 were cooled for solidification. It was confirmed that the capacitor 400 was bonded to the semiconductor device 100 by the spherical solder joints 191 and 192.

On the manufactured processing module, the volume of the solder joint 191 and the volume of the solder joint 192 were each 1.2 times the volume of each solder joint 193. The maximum width of the solder joint 191 and the maximum width of the solder joint 192 were each 7% larger than the maximum width of each solder joint 193. A void was formed between the capacitor 400 and the semiconductor device 100 and between the capacitor 400 and the printed wiring board 200. Further, a flux trace was confirmed to be on the solder resist 208 at positions where the solder pastes P1 and P2 were screen-printed.

Figure 9A:
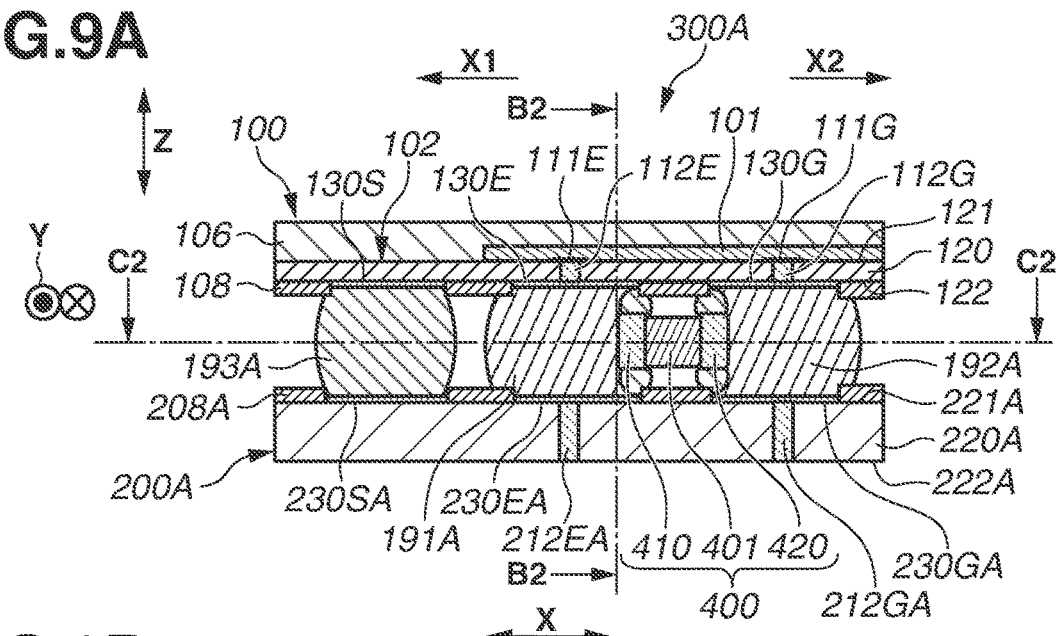
FIG. 9A is a cross-sectional schematic view illustrating a part of a processing module according to a second exemplary embodiment when viewed from the Y direction.
Figure 9B:
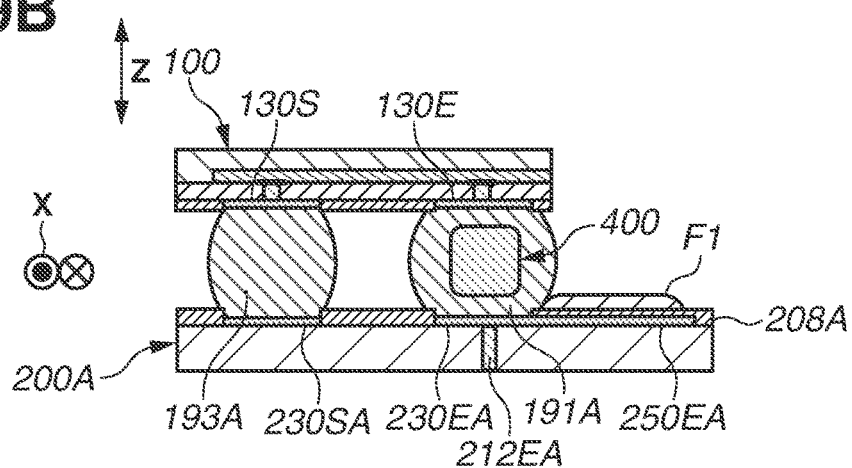
FIG. 9B is a cross-sectional schematic view taken along the B2-B2 line illustrated in FIG. 9A.
Figure 9C:
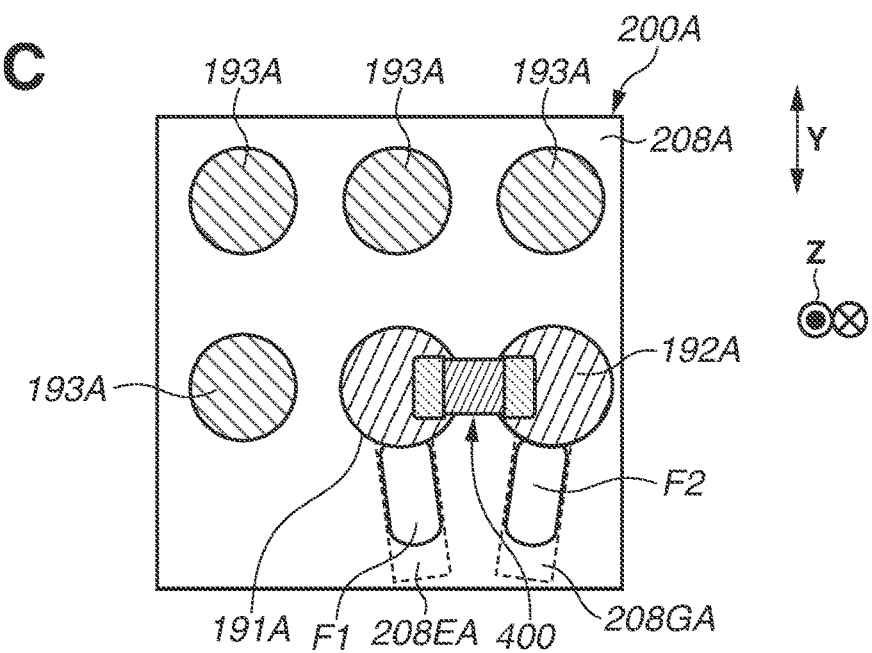
FIG. 9C is a cross-sectional schematic view taken along the C2-C2 line illustrated in FIG. 9A.

A second exemplary embodiment will now be described. The second exemplary embodiment is an exemplary embodiment when the capacitor 400 is disposed to build a bridge to the land disposed in the outermost periphery out of the lands disposed on the semiconductor device 100. FIGS. 9A to 9C are cross-sectional view schematically illustrating an enlarged part of the processing module according to the second exemplary embodiment. FIG. 9A is a cross-sectional view schematically illustrating the processing module 300A according to the second exemplary embodiment. FIG. 9B is a cross-sectional view taken along the B2-B2 line illustrated in FIG. 9A. FIG. 9C is a cross-sectional view taken along the C2-C2 line illustrated in FIG. 9A. FIGS. 9A and 9B schematically illustrate a layout relation between the semiconductor device 100, the capacitor 400, and the printed wiring board 200A. In the following descriptions, configurations similar to those in the first exemplary embodiment are assigned the same reference numerals, and detailed descriptions thereof will be omitted.

The processing module 300A according to the second exemplary embodiment includes the semiconductor device 100 and the printed wiring board 200A having a similar configuration to the first exemplary embodiment. Similarly to the first exemplary embodiment, the lands 130E, 130G, and 130S are disposed on the main surface 122 of the insulating substrate 120 included in the semiconductor device 100.

The printed wiring board 200A includes an insulating substrate 220A. The insulating substrate 220A includes a main surface 221A, and a main surface 222A on the side opposite to the main surface 221A. The printed wiring board 200A includes, on the main surface 221A, the land 230EA as the fourth land, the land 230GA as the fifth land, the lands 230SA as the sixth lands, a first conductor pattern 250EA, and a second conductor pattern 250GA.

The printed wiring board 200A includes a solder resist 208A as a film made of a solder resist material. The solder resist 208A is disposed on the main surface 221A. The lands 230EA, 230GA, and 230SA are exposed from a plurality of openings formed on the solder resist 208A. The solder resist 208A includes a plurality of guiding portions 208EA and 208GA that cover the first conductor pattern 250EA and the second conductor pattern 250GA, respectively (described below).

The lands 130E and 230EA are bonded by a solder joint 191A as a first solder joint formed of solder. The lands 130G and 230GA are bonded by a solder joint 192A as a second solder joint formed of solder. The lands 130S and 230SA are bonded by solder joints 193A as third solder joints formed of solder.

Similarly to the first exemplary embodiment, the processing module 300A includes the capacitor 400 to be used as a bypass capacitor. The capacitor 400 is disposed on the main surface 221A of the insulating substrate 220A of the printed wiring board 200A, i.e., between the semiconductor device 100 and the printed wiring board 200A. The electrode 410 of the capacitor 400 is connected to the solder joint 191A. More specifically, the electrode 410 of the capacitor 400 is electrically connected to the lands 130E and 230EA via the solder joint 191A. The electrode 420 of the capacitor 400 is connected to the solder joint 192A. More specifically, the electrode 420 of the capacitor 400 is electrically connected to the lands 130G and 230GA via the solder joint 192A.

The processing module 300A includes a first chip component guiding path 260EA and a second chip component guiding path 260GA. The first chip component guiding path 260EA and the second chip component guiding path 260GA guides the capacitor 400 to the solder joints 191A and 192A, respectively, when manufacturing the processing module 300A.

The first chip component guiding path 260EA as the first component guiding path includes the first conductor pattern 250EA, and the guiding portion 208EA of the solder resist for covering the first conductor pattern 250EA. The first conductor pattern 250EA extends from the land 230EA disposed on the main surface 221A of the insulating substrate 220A in the first direction that intersects with the longitudinal direction of the capacitor 400.

The length of the first conductor pattern 250EA in the Y direction is larger than a half of the widthwise length of the capacitor 400. When the processing module 300 is planarly viewed from the side of the semiconductor device 100 (when viewed from the top surface), the end of the first conductor pattern 250EA on the side not connecting with the land 230EA extends to the outside of the semiconductor device 100. The first conductor pattern 250EA is out of contact with the lands 230SA. The first conductor pattern 250EA is not directly connected to a wiring (not illustrated).

The second chip component guiding path 260GA as the second component guiding path includes the second conductor pattern 250GA, and the guiding portion 208GA of the solder resist for covering the second conductor pattern 250GA. The second conductor pattern 250GA extends from the land 230GA disposed on the main surface 221A of the insulating substrate 220A in the second direction that intersects with the longitudinal direction of the capacitor 400.

The length of the second conductor pattern 250GA in the Y direction is larger than a half of the widthwise length of the capacitor 400. When the processing module 300 is viewed from the top surface, the end of the second conductor pattern 250GA on the side not connecting with the land 230GA extends to the outside of the semiconductor device 100. The second conductor pattern 250GA is out of contact with the lands 230SA. The second conductor pattern 250GA is not directly connected to a wiring (not illustrated).

The first conductor pattern 250EA extends from the land 230EA in a direction approaching the second conductor pattern 250G. However, the first conductor pattern 250E and the second conductor pattern 250G may extend in parallel. This means that the first and the second directions can be the same. The first conductor pattern 250EA and the second conductor pattern 250GA are formed of a conductive metallic material, e.g., copper or gold.

When bonding the capacitor 400 as a chip component with the solder joints 191A and 192A, the first chip component guiding path 260EA and the second chip component guiding path 260GA guides the capacitor 400 to the bonding portion, respectively. Solder pastes are placed on the guiding portions 208EA and 208GA and the capacitor 400 is disposed on the solder pastes. When the solder pastes are heated and melted, the capacitor 400 is guided to the bonding portion.

According to the second exemplary embodiment, the first chip component guiding path 260EA and the second chip component guiding path 260GA are extended to the outside of the semiconductor device 100, as illustrated in FIG. 9B. By extending the chip component guiding paths 260EA and 260GA to the outside of the semiconductor device 100, the capacitor 400 can be mounted outside the semiconductor device 100. Mounting the capacitor 400 outside the semiconductor device 100 enables a visual inspection after the parts mounting.

The length of the first conductor pattern 250EA and the length of the second conductor pattern 250GA are each larger than a half of the widthwise length of the capacitor 400, thereby making it possible to place sufficient amounts of solder pastes to stably guide the capacitor 400. It is desirable that the first conductor pattern 250E extends from the land 230E in a direction approaching the second conductor pattern 250G. This is because mounting the first conductor pattern 250EA and the second conductor pattern 250GA in this way enables these patterns to extend further. It is desirable that the width of the first conductor pattern 250EA and the width of the second conductor pattern 250GA are more than or equal to the widths of the electrodes of the capacitor 400. This prevents the capacitor 400 from falling off the guiding paths to stably move the capacitor 400.

When the above-described process for heating and melting solder pastes is performed, the flux F1 remains on the guiding portion 208EA, and the flux F2 remains on the guiding portion 208GA.

It is desirable that the fluxes F1 and F2 are provided only on the guiding portions 208EA and 208GA. This is intended to prevent an ion migration phenomenon that occurs when fluxes remaining on the guiding paths come into contact with each other or come into contact with a neighboring flux.

It is desirable that the volume of the first solder joint 191A and the volume of the second solder joint 192A are each larger than the volume of each third solder joint 193A. Adopting such a configuration makes it easier to control the layout of the capacitor 400 with a high accuracy. More desirably, the volume of the first solder joint 191A and the volume of the second solder joint 192A are more than 1.2 times the volume of each third solder joint 193A. It is also desirable that the volume of the first solder joint 191A and the volume of the second solder joint 192A are each less than four times the volume of each third solder joint 193A. If the volume of the first solder joint 191A and the volume of the second solder joint 192A are more than or equal to four times the volume of each third solder joint 193, solder joints cannot be placed at narrow pitches, and the semiconductor device 100 may not possibly be reduced in size.

Regarding the processing module 300A, the capacitor 400 can be connected to the solder joints by using component guiding paths having two different conductor patterns covered by the guiding portions of the solder resist. The above-described disclosure can thereby provide a semiconductor module in which the layout of the bypass capacitor is controlled with higher accuracy than the prior art.

(Processing Module Manufacturing Method 3)

A method of manufacturing the processing module 300A will now be described. FIGS. 10A to 10D and 11A to 11C illustrate a method for manufacturing the processing module 300A according to the second exemplary embodiment. A side view and a top view are illustrated for each step.

Figure 10A:
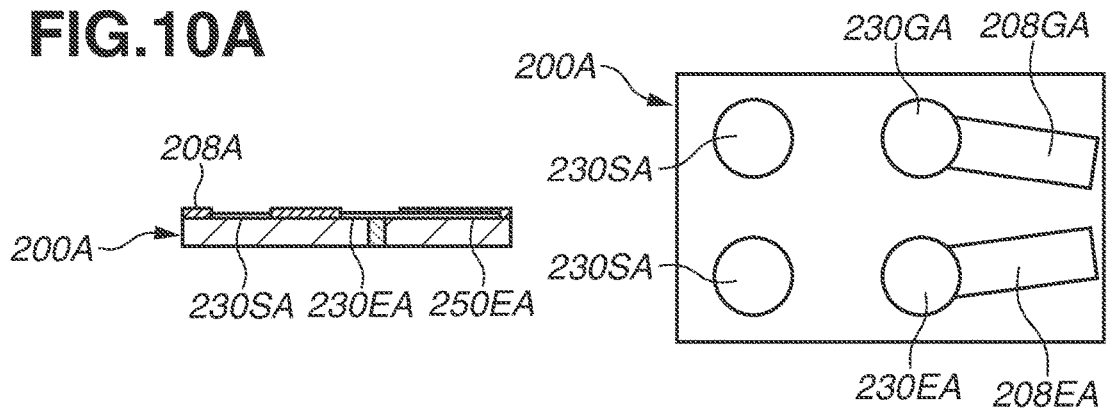
FIGS. 10A to 10D illustrate a method of manufacturing the processing module according to the second exemplary embodiment.

As illustrated in FIG. 10A, the printed wiring board 200A is prepared (Step S21).

The printed wiring board 200A includes the lands 230EA, 230GA, and 230SA, the first conductor pattern 250EA, the second conductor pattern 250GA, and the solder resist 208A on the main surface 221A. The solder resist 208A is provided with the guiding portions 208EA and 208GA, and a plurality of openings. The lands 230EA, 230GA, and 230SA are exposed from the openings of the solder resist 208A. In step S11, the semiconductor device 100 and the capacitor 400 are also prepared.

Figure 10B:
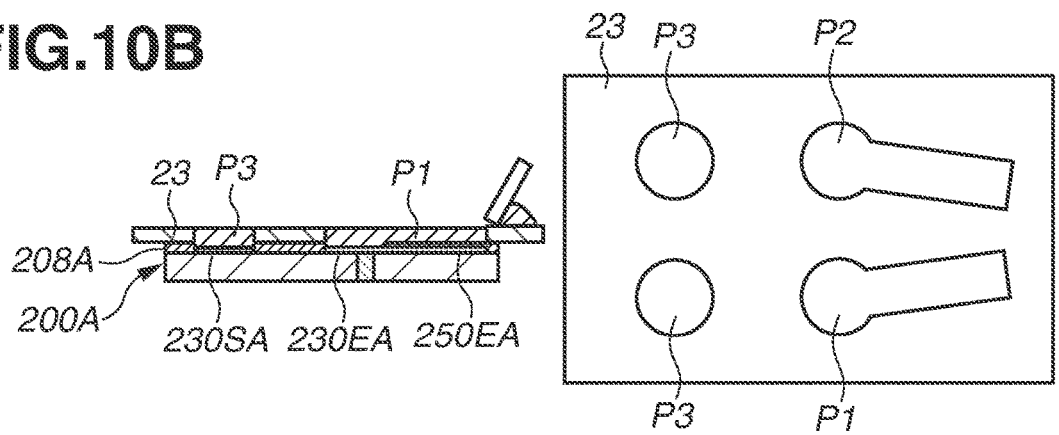

As illustrated in FIG. 10B, the solder paste P1 as the first solder paste, the solder paste P2 as the second solder paste, and the solder pastes P3 as the third solder pastes are supplied across a distance from each other on the printed wiring board 200A (Step S22). The solder paste P1 is supplied onto the land 230EA as the third land and onto the guiding portion 208EA. The solder paste P2 is supplied onto the land 230GA as the fourth land and onto the guiding portion 208GA. The solder pastes P3 are supplied onto the lands 230SA as the fifth lands.

The solder pastes P1, P2, and P3 contain solder powder and flux components used for soldering. Although, in the present disclosure, the solder pastes P1, P2 and P3 are made of the same material, the solder pastes do not need to be made of the same material as long as the temperatures of their melting points are close. In step S12, the solder pastes P1, P2 and P3 are supplied to the printed wiring board 200A through screen printing using a metal mask 23. The method of supplying the solder pastes P1, P2, and P3 is not limited thereto. For example, a dispenser may be used.

Figure 10C:
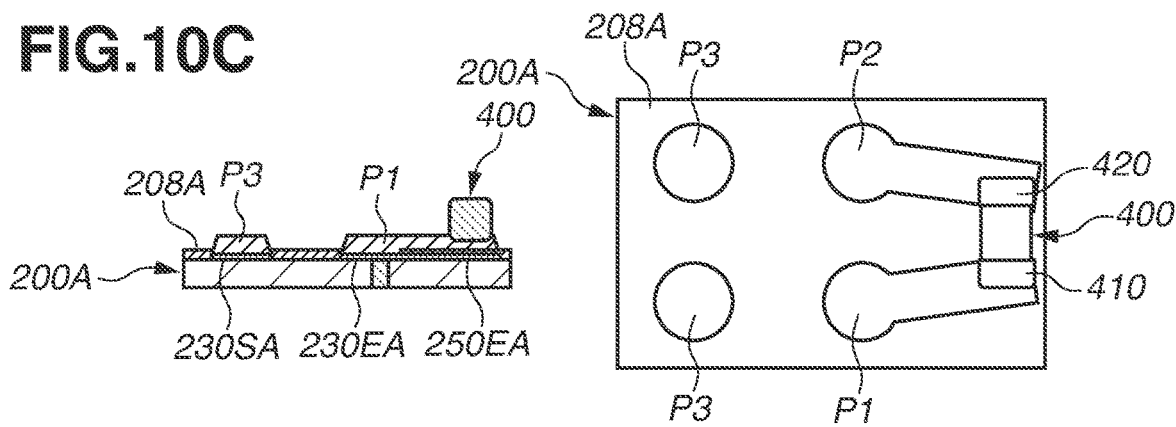

As illustrated in FIG. 10C, the capacitor 400 is then mounted such that the electrode 410 comes into contact with the solder paste P1 on the guiding portion 208EA, and the electrode 420 comes into contact with the solder paste P2 on the guiding portion 208GA. More specifically, the capacitor 400 is mounted in the vicinity of the tips in a direction away from the lands 230EA and 230GA, respectively (Step S23), on the solder pastes P1 and P2 provided on the guiding portions 208E and 208G. Thus, the bottom face 415 of the electrode 410 comes into contact with the solder paste P1, and the bottom face 425 of the electrode 420 comes into contact with the solder paste P2.

Figure 10D:
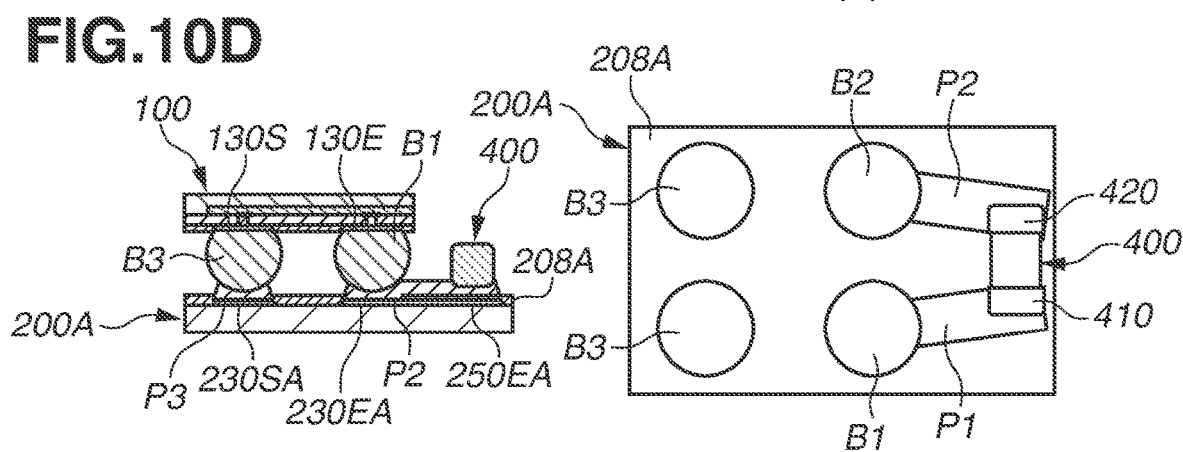

The semiconductor device 100 is then mounted on the printed wiring board 200A such that the land 130E faces the land 230EA, and the land 130G faces the land 230GA (Step S24), as illustrated in FIG. 10D. In this case, the mounting position of the semiconductor device 100 is adjusted such that the land 130E faces the land 230EA, the land 130G faces the land 230GA, and the lands 130S face the lands 230SA. The lands 130E, 130G, and 130S of the semiconductor device 100 are provided with the solder balls B1, B2, and B3, respectively. Thus, the semiconductor device 100 is mounted on the printed wiring board 200A so that solder ball B1 faces the land 230E, the solder ball B2 faces the land 230G, and the solder balls B3 face the lands 230S. In step S24, when the semiconductor device 100 is mounted on the printed wiring board 200A, the solder balls B1, B2, and B3 come into contact with the solder pastes P1, P2, and P3, respectively. In step S24, the positional relations between the printed wiring board 200A, the capacitor 400, and the semiconductor device 100 are as illustrated in FIG. 10D when viewed from the Z direction. The lands 130E, 130G, and 130S of the semiconductor device 100 are each partially or entirely overlapped with the lands 230EA, 230GA, and 230SA of the printed wiring board 200A, respectively, when viewed from the Z direction. When the semiconductor device 100 is mounted, the capacitor 400 is out of contact with the solder balls B1 and B2 and is mounted outside the semiconductor device 100. This enables performing a defect inspection of the capacitor 400 even after the semiconductor device 100 is mounted.

In a state where the semiconductor device 100 and the capacitor 400 are mounted on the printed wiring board 200A, these components are conveyed to a reflow furnace (not illustrated). In step S25 illustrated in FIG. 11A, the temperature of the atmosphere in the reflow furnace is then adjusted to the temperature of the melting point of the solder powder or higher, and then the solder pastes P1, P2, and P3 and the solder balls B1, B2, and B3 are heated and melted. When the solder paste P1 and the solder ball B1 are melted, a fluid molten solder M1 is formed. When the solder paste P2 and the solder ball B2 are melted, a fluid molten solder M2 is formed. When the solder pastes P3 and the solder balls B3 are melted, fluid molten solders M3 are formed.

Figure 11A:
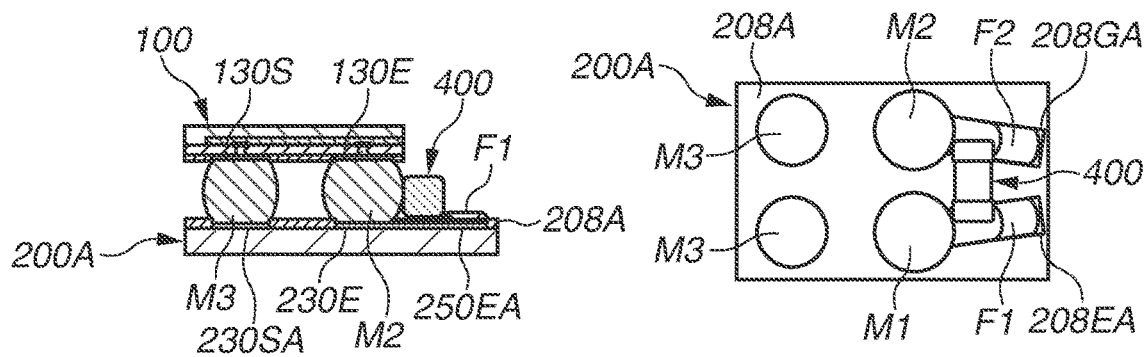
FIGS. 11A to 11C illustrate a method of manufacturing the processing module according to the second exemplary embodiment.
Figure 11B:
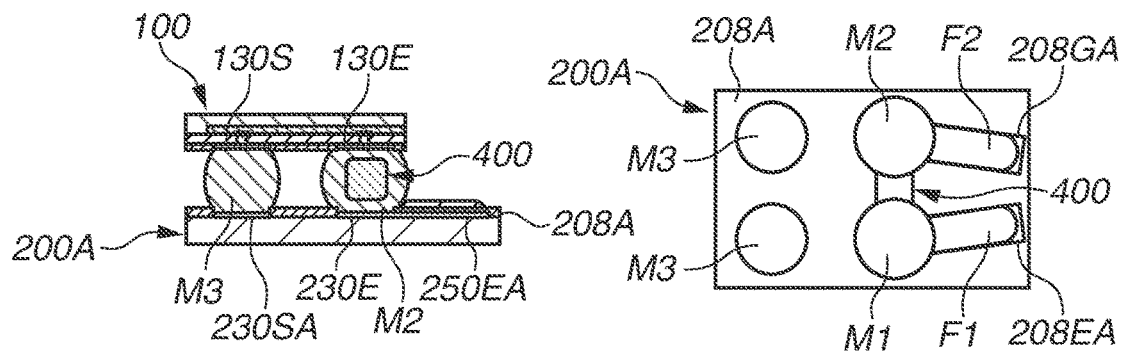

In step S26 illustrated in FIG. 11B, following step S25, heating is continued to fluidize the molten solders M1 and M2. The molten solders M1 and M2 on the guiding portions 208GA and 208EA are agglomerated on the lands 230EA and 230GA, respectively. Thus, the capacitor 400 mounted on the guiding portions 208EA and 208GA reaches the lands 230E and 230G through the agglomeration of the molten solders M1 and M2, respectively. When the capacitor 400 reaches the lands 230EA and 230GA, the capacitor 400 is raised in an upper direction approaching the semiconductor device 100 by the force received from the molten solders M1 and M2, respectively. As a result, the distance between the top face 414 of the electrode 410 and the 130E decreases, and the distance between the top face 424 of the electrode 420 and the land 130G also decreases. More specifically, the element 401 of the capacitor 400 is disposed across a void with each of the semiconductor device 100 and the printed wiring board 200A. Then, the fluxes F1 and F2 contained in the solder pastes P1 and P2 remain on the chip component guiding paths 260EA and 260GA, respectively.

Figure 11C:
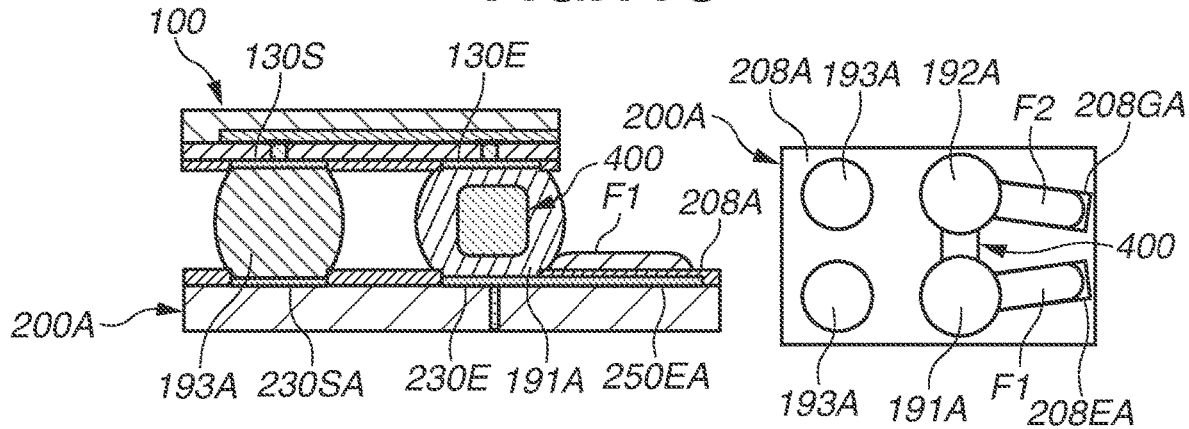

The molten solders M1, M2, and M3 are subsequently cooled for solidification. As illustrated in FIG. 11C, the solder joint 191A is formed where the lands 130E and 230EA and the electrode 410 are bonded with solder. The solder joint 192A is also formed where the lands 130G and 230GA and the bonded electrode 420 are bonded with solder. The solder joints 193A are formed where the lands 130S and 230SA are bonded with solder. In this case, the volume of the solder joint 191A and the volume of the solder joint 192A are each larger than the volume of each solder joint 193A. Although the solder balls B1, B2, and B3 are fixed in size, the paste P1 placed on the guiding portion 208EA adheres to the solder ball B1 and then solidifies, and the paste P2 placed on the guiding portion 208GA adheres to the solder ball B2 and then solidifies. More specifically, the volumes of the solder joints 191A and 192A can be controlled by the amounts of the solder pastes P1 and P2 to be placed on the guiding portions 208EA and 208GA, respectively. The processing module 300A illustrated in FIGS. 9A to 9C is manufactured by the above-described processes.

The camera main body 601, i.e., the digital camera 600 is thus manufactured by storing the processing module 300A in the housing 611 illustrated in FIG. 1.

According to the process of the present disclosure, the capacitor 400 as a chip component is guided to the bonding portion by the first chip component guiding path 260EA and the second chip component guiding path 260GA. The manufacturing method of the present disclosure can therefore provide a semiconductor module manufacturing method that enables controlling the layout of the bypass capacitor with higher accuracy than the prior art. The capacitor 400 is disposed across a void with each of the semiconductor device 100 and the printed wiring board 200A. Thus, bonding is made in a solder bonding form that is axisymmetric with reference to the straight line connecting the centers of the solder joints 191A and 192A. Thus, no unique point occurs where stress is concentrated after the bonding, thereby improving the bonding reliability of the processing module 300. When the semiconductor device 100 is mounted, the capacitor 400 is out of contact with the solder balls B1 and B2 and is mounted outside the semiconductor device 100. This enables performing a defect inspection of the capacitor 400 even after the semiconductor device 100 is mounted.

A second sample corresponding to the second exemplary embodiment will now be described. On the semiconductor device 100 according to the second sample, the pitch between the solder balls B1 and B2 as two adjacent ball terminals before the bonding was 0.65 mm. The pitch between the solder balls B1 and B3 and the pitch between the solder balls B2 and B3 were each 0.80 mm. The capacitor 400 was a chip component of the 0402 size.

The thickness of each land of the semiconductor device 100 and the printed wiring board 200 was 0.015 mm, and the thickness of the solder resist was 0.020 mm. The height from the conductor pattern to the top face of the solder resist as a guiding path was 0.020 mm. The height of the chip component guiding paths was 0.35 mm.

The size of the lands 130E, 130G, and 130S of the semiconductor device 100 was φ0.3 mm. The size of the lands 230EA, 230GA, and 230SA of the printed wiring board 200A was φ0.3 mm.

The first conductor pattern 250EA and the second conductor pattern 250GA as chip component guiding paths extending from the lands 230EA and 230GA of the printed wiring board 200A, respectively, were 0.175 mm in width and 0.8 mm in length.

As illustrated in FIG. 10A, the first conductor pattern 250EA and the second conductor pattern 250GA extend from the lands 230EA and 230GA, respectively, so that the gap between these two conductor patterns decreases toward a direction orthogonal to the longitudinal direction of the capacitor 400.

As illustrated in FIG. 10B, in the screen printing process, solder pastes were provided to the land 230EA and the guiding portion 208EA and to the land 230GA and the guiding portion 208GA by using a printing plate so that the land and the guiding portion of each pair were the same in size when viewed from the top surface. The thickness of the printing plate was 0.1 mm.

As illustrated in FIG. 10C, after the solder printing, the capacitor 400 was mounted in the vicinity of the tips of the solder pastes P1 and P2 applied on the guiding portions 208EA and 208GA, respectively, on the side away from the lands.

As illustrated in FIG. 10D, the semiconductor device 100 was mounted on the printed wiring board 200 such that the land 130E faces the land 230EA, the land 130G faces the land 230GA, and the lands 130S face the lands 230SA. In this case, the chip component guiding paths 260EA and 260GA were extended to the outside of the outer edge of the semiconductor device 100, and the capacitor 400 was mounted outside the outer edge of the semiconductor device 100. As illustrated in FIG. 11A, the semiconductor device 100, the capacitor 400, and the printed wiring board 200A were then subjected to reflow heating with the peak temperature of the atmosphere in the reflow furnace set to 230° C. or higher. Then, these components were cooled down.

As illustrated in FIGS. 11A and 11B, the solder pastes P1 and P2 applied on the guiding portions 208EA and 208GA were agglomerated onto the lands 230EA and 230GA, respectively. While the solder pastes P1 and P2 were agglomerated, the capacitor 400 was guided to the solder joints 191A and 192A and then bonded at 0.65 mm pitches.

Since the capacitor 400 moved above the guiding portions 208EA and 208GA the solder resists, the capacitor 400 was stably moved to the solder joints 191A and 192A without being affected as in a case where there is a step on the printed wiring board 200A.

Since the height of the chip component guiding paths was sufficiently higher than the height of the lands 230EA and 230GA of the printed wiring board 200A, the capacitor 400 was stably guided to the centers of the solder joints 191A and 192A. Since the solder joints 191A and 192A are spherical in shape, no unique point occurred where stress was concentrated, resulting in the improved bonding reliability.

The gap between the chip component guiding paths 260EA and 260GA decreases toward a direction orthogonal to the longitudinal direction of the capacitor 400 when the printed wiring board 200A was viewed from the top surface. This enabled stably drawing the capacitor 400 into the gap between the solder balls of the semiconductor device 100 having a wider pitch than the longitudinal size of the capacitor 400, and then bonding the capacitor 400. Further, the above-described configuration enabled providing chip component guiding paths only in the region used for guiding the chip component without disturbing the wiring and ground (GND) patterns formed between the solder balls.

Since the capacitor 400 is mounted at a position where the semiconductor device 100 is not overlapped when viewed from the top surface, a visual inspection after the parts mounting enables quality control through inspections on parts defect, parts shift, and parts stand failure after the parts mounting.

A third sample corresponding to the second exemplary embodiment will now be described. Similarly to the second sample, the third sample corresponds to the second exemplary embodiment. On the semiconductor device 100, the pitch between the solder balls B1 and B2 as two adjacent ball terminals before bonding was 0.40 mm. The pitch between the solder balls B1 and B3 and the pitch between the solder balls B2 and B3 were also 0.40 mm. The capacitor 400 was a chip component of the 0402 size, similarly to the second sample.

On the semiconductor device 100 and the printed wiring board 200A, each land was 0.015 mm in thickness, and the solder resists were 0.020 mm in thickness. The height from the top surface of the conductor patterns to the top face of the solder resists as guiding paths was 0.020 mm. The height of the chip component guiding paths was 0.35 mm.

The size of the lands 130E, 130G, and 130S of the semiconductor device 100 was φ0.24 mm. The size of the lands 230EA, 230GA, and 230SA of the printed wiring board 200 was φ0.24 mm.

The first conductor patterns 250EA and the second conductor pattern 250GA as chip component guiding paths extending from the lands 230EA and 230GA of the printed wiring board 200A, respectively, were 0.175 mm in width and 0.8 mm in length.

Figure 12:
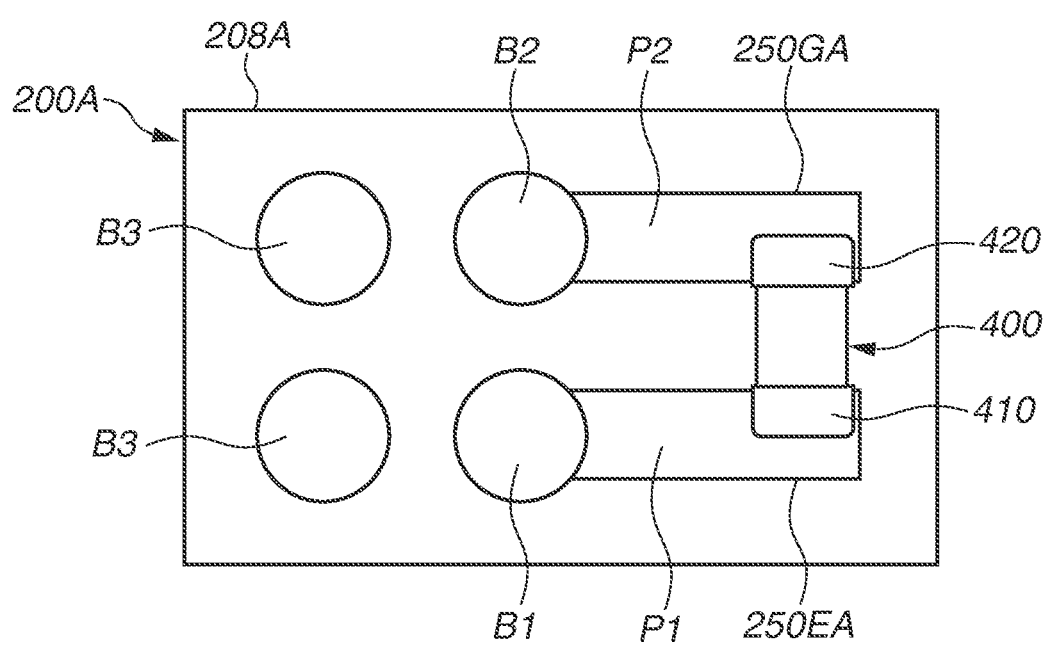
FIG. 12 illustrates a part of a manufacturing process of a processing module according to a third sample.

FIG. 12 is a schematic view (Step S24) corresponding to the third sample, illustrating only the solder balls B1, B2, and B3 of the semiconductor device 100.

As illustrated in FIG. 12, the first conductor pattern 250EA and the second conductor pattern 250GA extend from the lands 230EA and 230GA, respectively, so that the gap between the two conductor patterns remains constant toward a direction orthogonal to the longitudinal direction of the capacitor 400. When viewed from the top surface, the first conductor pattern 250EA and the second conductor pattern 250GA extend orthogonally to the longitudinal direction of the capacitor 400.

In the screen printing process, solder pastes were provided onto the land 230EA and the guiding portion 208EA and to the land 230GA and the guiding portion 208GA by using a printing plate so that the land and the guiding portion of each pair are the same in size when viewed from the top surface. The thickness of the printing plate was 0.1 mm.

The processing module 300A according to the third sample is manufactured in the subsequent steps which are similar to those according to the second sample.

Even in the case where the longitudinal size of the capacitor 400 was the same as the pitch between the solder balls of the semiconductor device 100, similar effects to the second sample were obtained by extending the conductor patterns 250EA and 250GA in a direction orthogonal to the longitudinal direction of the capacitor 400.

The present disclosure is not limited to the above-described exemplary embodiments but can be modified in diverse ways without departing from the technical concepts thereof. Effects according to the above-described exemplary embodiments are to be considered as merely an enumeration of desirable effects derived from the present disclosure, and effects of the present disclosure are not limited thereto.

Although the above-described exemplary embodiments are based on a case where the capacitor 400 is used as an electronic component, the present disclosure is not limited thereto. The electronic component may be a passive component such as a resistor or inductor.

Although the above-described exemplary embodiments are based on a case where the semiconductor device 100 with the solder balls B3 provided on the lands 230S is prepared, the present disclosure is not limited thereto. In other words, the solder balls B3 may be provided on the lands 230S in the step where the semiconductor device 100 is prepared.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Applications No. 2021-091341, filed May 31, 2021, and No. 2021-091342, filed May 31, 2021, which are hereby incorporated by reference herein in their entirety.

What is claimed is:

1. A semiconductor module comprising: a semiconductor device having a first land, a second land, and a third land; a wiring board having a substrate, a fourth land, a fifth land, and a sixth land disposed on a main surface of the substrate; a chip component having a first electrode and a second electrode disposed across a distance in a longitudinal direction and being disposed between the wiring board and the semiconductor device; a first solder joint configured to bond the first land, the fourth land, and the first electrode; a second solder joint configured to bond the second land, the fifth land, and the second electrode; and a third solder joint configured to bond the third land and the sixth land, wherein a volume of the first solder joint and a volume of the second solder joint are each larger than a volume of the third solder joint, wherein the volume of the first solder joint is greater than or equal to 1.2 times the volume of the third solder joint, and wherein the volume of the second solder joint is greater than or equal to 1.2 times the volume of the third solder joint.

2. The semiconductor module according to claim 1, wherein an area of a largest land of the fourth land, the fifth land, and the sixth land is less than or equal to 1.1 times an area of a smallest land of the fourth land, the fifth land, and the sixth land.

3. The semiconductor module according to claim 1,
wherein the first electrode of the chip component is separated from the first land of the semiconductor device,
wherein the first electrode of the chip component is separated from the fourth land of the wiring board,
wherein the second electrode of the chip component is separated from the second land of the semiconductor device, and
wherein the second electrode of the chip component is separated from the fifth land of the wiring board.

4. The semiconductor module according to claim 1,
wherein the first solder joint and the third solder joint are adjacent to each other in a first direction, and
wherein a length of the first solder joint in the first direction is greater than a length of the third solder joint in the first direction.

5. The semiconductor module according to claim 1,
wherein the wiring board is a printed wiring board,
wherein the printed wiring board has a solder resist, the solder resist being disposed on the main surface of the substrate and having a plurality of openings and a plurality of guiding portions,
wherein the semiconductor module further includes a first conductor pattern, the first conductor pattern being disposed on the main surface of the substrate and extending from the fourth land in a first direction intersecting with the longitudinal direction of the chip component,
wherein the semiconductor module further includes a second conductor pattern, the second conductor pattern being disposed on the main surface of the substrate and extending from the fifth land in a second direction intersecting with the longitudinal direction of the chip component,
wherein the fourth land, the fifth land, and the sixth land are exposed from the plurality of openings, and
wherein the first conductor pattern and the second conductor pattern are each covered by one or more of the plurality of guiding portions of the solder resist.

6. The semiconductor module according to claim 1, wherein the chip component is a chip component of a size smaller or equal to 0402 size.

7. The semiconductor module according to claim 1, wherein the chip component is a capacitor.

8. The semiconductor module according to claim 1, wherein the semiconductor device is a semiconductor package with a ball grid array (BGA) in which a distance between lands is less than or equal to 0.4 mm.

9. An electronic apparatus comprising:
a housing; and
the semiconductor module according to claim 1 disposed inside the housing.

10. A semiconductor module comprising: a semiconductor device having a first land and a second land; a printed wiring board having an insulating substrate, a solder resist having a plurality of openings and a plurality of guiding portions disposed on a main surface of the insulating substrate, and a fourth land and a fifth land exposed from the plurality of openings disposed on the main surface of the insulating substrate; a chip component having a first electrode and a second electrode disposed across a distance in a longitudinal direction and being disposed between the printed wiring board and the semiconductor device; a first solder joint configured to bond the first land, the fourth land, and the first electrode; a second solder joint configured to bond the second land, the fifth land, and the second electrode; a first conductor pattern extending from the fourth land disposed on the main surface of the insulating substrate in a first direction intersecting with the longitudinal direction of the chip component; and a second conductor pattern extending from the fifth land disposed on the main surface of the insulating substrate in a second direction intersecting with the longitudinal direction of the chip component, wherein the first conductor pattern and the second conductor pattern are each covered by one or more of the plurality of guiding portions of the solder resist, wherein a width of the first conductor pattern is larger than or equal to a length of the first electrode in the longitudinal direction of the chip component, and wherein a width of the second conductor pattern is larger than or equal to a length of the second electrode in the longitudinal direction of the chip component.

11. The semiconductor module according to claim 10,
wherein the printed wiring board further includes a plurality of sixth lands on the main surface of the insulating substrate, the plurality of sixth lands being disposed more in a vicinity of an outer edge of the main surface of the insulating substrate than the fourth land, wherein a length of the first conductor pattern in the first direction is larger than a half of a widthwise length of the chip component, and is shorter than a shortest distance between the fourth land and the plurality of sixth lands, and wherein a length of the second conductor pattern in the second direction is larger than a half of the widthwise length of the chip component, and is shorter than a shortest distance between the fifth land and the plurality of sixth lands.

12. The semiconductor module according to claim 11, wherein the semiconductor device further comprises a third land, the third land being adjacent to the first land and/or the second land, wherein the semiconductor module further comprises a third solder joint configured to bond the third land and the sixth land, and wherein a volume of the first solder joint and a volume of the second solder joint are each larger than a volume of the third solder joint.

13. The semiconductor module according to claim 10, wherein the first land and the second land are each disposed on an outermost periphery, wherein a length of the first conductor pattern in the first direction is larger than a half of a widthwise length of the chip component, wherein a length of the second conductor pattern in the second direction is larger than a half of the widthwise length of the chip component, and wherein, when the semiconductor module is viewed from a top surface, the first conductor pattern and the second conductor pattern extend to outside of the semiconductor device.

14. The semiconductor module according to claim 10, wherein flux is disposed on the at least one of the plurality of guiding portions of the solder resist.

15. The semiconductor module according to claim 14, wherein the flux is disposed only on the plurality of guiding portions on the solder resist.

16. The semiconductor module according to claim 10, wherein the first conductor pattern and the second conductor pattern are not connected with wiring.

17. The semiconductor module according to claim 10, wherein the first conductor pattern extends from the third land in a direction approaching the second conductor pattern.

18. An electronic apparatus comprising:

a housing; and the semiconductor module according to claim 10 disposed inside the housing.

\* \* \* \* \*